(12) United States Patent
Jeon et al.

(10) Patent No.: US 12,408,533 B2
(45) Date of Patent: Sep. 2, 2025

(54) DISPLAY DEVICE HAVING A REPAIR PORTION

(71) Applicant: Samsung Display Co., Ltd., Yongin-Si (KR)

(72) Inventors: Youngjae Jeon, Yongin-si (KR); Woogeun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 799 days.

(21) Appl. No.: 17/559,983

(22) Filed: Dec. 22, 2021

(65) Prior Publication Data

US 2022/0344625 A1    Oct. 27, 2022

(30) Foreign Application Priority Data

Apr. 27, 2021   (KR) .......................... 10-2021-0054632

(51) Int. Cl.
*H10K 59/38* (2023.01)
*H10K 59/121* (2023.01)
*H10K 59/126* (2023.01)
*H10K 59/131* (2023.01)
*H10K 71/00* (2023.01)

(52) U.S. Cl.
CPC ......... *H10K 59/38* (2023.02); *H10K 59/1216* (2023.02); *H10K 59/126* (2023.02); *H10K 59/131* (2023.02); *H10K 71/00* (2023.02); *H10K 71/861* (2023.02)

(58) Field of Classification Search
CPC ............. H10K 59/131; H10K 59/1216; H10K 59/123; H10K 71/861; H10K 71/00; H10K 59/126; H10K 59/38; H10K 59/88; H10L 27/124; H10L 23/481; H10L 23/535; G09G 2300/426; G09G 2300/0426; H10D 86/441
See application file for complete search history.

(56) References Cited

U.S. PATENT DOCUMENTS

| | | |
|---|---|---|
| 6,515,720 B1 | 2/2003 | Iizuka et al. |
| 9,904,133 B2 | 2/2018 | Cha et al. |
| 10,140,914 B2 * | 11/2018 | Kim ..................... H10K 59/123 |
| 10,249,700 B2 | 4/2019 | Ai et al. |

(Continued)

FOREIGN PATENT DOCUMENTS

| | | | |
|---|---|---|---|
| JP | 1454961 B2 | 4/2010 | |
| JP | 4454961 B2 | 4/2010 | |

(Continued)

*Primary Examiner* — William B Partridge
*Assistant Examiner* — Erik A. Anderson
(74) *Attorney, Agent, or Firm* — Innovation Counsel LLP

(57) ABSTRACT

Provided are a display device in which a bright spot occurring due to a defective pixel circuit may be repaired into a dark spot, and a method of repairing the display device. The display device includes a substrate, a thin-film transistor arranged on the substrate and including a semiconductor layer and a gate electrode overlapping at least a portion of the semiconductor layer, a pixel electrode on the substrate, a node connection line connecting the thin-film transistor and the pixel electrode to each other, and an initialization voltage line arranged on the substrate and extending in a first direction, wherein the node connection line includes a repair portion overlapping the initialization voltage line in a plan view.

14 Claims, 14 Drawing Sheets

(56) References Cited

U.S. PATENT DOCUMENTS

| | | | |
|---|---|---|---|
| 10,950,669 B2* | 3/2021 | Lee | G06F 3/0412 |
| 11,092,841 B2* | 8/2021 | Baek | G02F 1/133504 |
| 11,152,450 B2* | 10/2021 | Kang | H10K 59/88 |
| 11,665,947 B2 | 5/2023 | Kim et al. | |
| 11,765,948 B2* | 9/2023 | Kim | H10K 59/124 |
| | | | 257/71 |
| 11,770,960 B2 | 9/2023 | Choe | |
| 2015/0108467 A1* | 4/2015 | Moriguchi | H10D 99/00 |
| | | | 257/43 |
| 2022/0020947 A1* | 1/2022 | Park | H10K 59/123 |
| 2022/0199728 A1* | 6/2022 | Park | H10K 59/1213 |

FOREIGN PATENT DOCUMENTS

| | | |
|---|---|---|
| JP | 2020-0503636 A | 1/2020 |
| KR | 10-2000-0011686 A | 2/2000 |
| KR | 10-2078807 B1 | 2/2020 |
| KR | 10-2021-0016141 A | 2/2021 |
| KR | 10-2021-0030538 A | 3/2021 |

* cited by examiner

DISPLAY DEVICE HAVING A REPAIR PORTION

CROSS-REFERENCE TO RELATED APPLICATION

This application is based on and claims priority under 35 U.S.C. § 119 to Korean Patent Application No. 10-2021-0054632, filed on Apr. 27, 2021, in the Korean Intellectual Property Office, the disclosure of which is incorporated by reference herein in its entirety.

BACKGROUND

1. Field

The present disclosure generally relates to a display device. More particularly, the present disclosure relates to a display device having a structure capable of a darkening repair when a bright spot defect occurs, and a method of repairing the display device.

2. Description of the Related Art

Display devices provide visual information such as images or videos to a user. With the development of various electronic devices such as televisions, computers, mobile phones, and tablet personal computers (PCs), display devices of various types applicable thereto have been developed.

Such a display device includes a scan line and a data line insulated from each other, and includes a plurality of pixel circuits connected to the scan line and the data line. Each of the pixel circuits includes a plurality of thin-film transistors and a storage capacitor, and may drive a light-emitting element.

Meanwhile, in a process of manufacturing the display device, a defect may occur in some pixel circuits. A defect, for example, a short-circuit or opening of a thin-film transistor or a signal line of a pixel circuit may occur.

SUMMARY

When a defect occurs in a pixel circuit, a light-emitting element driven by the defective pixel circuit may always generate light regardless of a scan signal and a data signal. A pixel always emitting light as described above may be recognized as a bright spot to a user, causing a bright spot defect of the display device. In particular, with the recent increase in size and high resolution of display devices, the possibility of such a defect in the pixel circuit and a bright spot defect of the display device has increased.

To resolve various problems including the above issues, one or more embodiments include a display device capable of making the display device into a normal product by repairing bright spots occurring due to a defective pixel circuit into dark spots, and a method of repairing the display device. However, these objectives are examples and do not limit the scope of the present disclosure.

Additional aspects will be set forth in part in the description which follows and, in part, will be apparent from the description, or may be learned by practice of the embodiments of the present disclosure.

According to an embodiment, a display device includes a substrate, a thin-film transistor arranged on the substrate and including a semiconductor layer and a gate electrode overlapping at least a portion of the semiconductor layer, a pixel electrode arranged on the substrate, a node connection line configured to connect the thin-film transistor and the pixel electrode to each other, and an initialization voltage line arranged on the substrate and extending in a first direction, wherein the node connection line includes a repair portion overlapping the initialization voltage line in a plan view.

The display device may further include a data line arranged on the substrate and extending in the first direction, and the initialization voltage line may be arranged closer to the thin-film transistor than the data line in a plan view.

The node connection line may not overlap the data line in a plan view.

The display device may further include a storage capacitor including a first capacitor plate and a second capacitor plate overlapping each other, and the first capacitor plate and the gate electrode of the thin-film transistor may include a same material, and the second capacitor plate may include a portion of the node connection line.

The display device may further include a bottom metal layer arranged between the substrate and the semiconductor layer of the thin-film transistor.

The initialization voltage line and the bottom metal layer may include a same material.

The display device may further include a storage capacitor including a first capacitor plate and a third capacitor plate overlapping each other, and the first capacitor plate and the gate electrode of the thin-film transistor may include a same material, and the third capacitor plate may include a portion of the bottom metal layer.

The repair portion of the node connection line may be connected to the initialization voltage line through a contact hole.

The display device may further include a scan line extending in a second direction crossing the first direction, and a branch line extending in the first direction from the scan line.

The scan line, the branch line, and the gate electrode of the thin-film transistor may include a same material.

The display device may further include an opposite electrode arranged on the pixel electrode, and an emission layer arranged between the pixel electrode and the opposite electrode.

The display device may further include an auxiliary line disposed between the repair portion of the node connection line and the initialization voltage line, and electrically connected to the initialization voltage line.

The auxiliary line and the gate electrode of the thin-film transistor may include a same material.

The repair portion of the node connection line may be electrically connected to the initialization voltage line through the auxiliary line.

According to an embodiment, a display device includes a substrate, a thin-film transistor arranged on the substrate and including a semiconductor layer and a gate electrode overlapping at least a portion of the semiconductor layer, an initialization voltage line arranged on the substrate and extending in a first direction, a pixel electrode arranged on the substrate and electrically connected to the thin-film transistor, and an upper insulating film arranged on the pixel electrode, and including an opening corresponding to a portion of the pixel electrode, wherein the pixel electrode includes a repair portion overlapping the initialization voltage line in a plan view, and the repair portion does not overlap the opening of the upper insulating film.

The display device may further include a data line arranged on the substrate and extending in the first direction, and the initialization voltage line may be arranged between the data line and the thin-film transistor.

The display device may further include a bottom metal layer arranged between the substrate and the semiconductor layer of the thin-film transistor, and the initialization voltage line and the bottom metal layer may include a same material.

The repair portion of the pixel electrode may be connected to the initialization voltage line through a contact hole.

According to an embodiment, a method of repairing a display device which includes a substrate, a thin-film transistor arranged on the substrate and comprising a semiconductor layer and a gate electrode overlapping at least a portion of the semiconductor layer, a pixel electrode on the substrate, an initialization voltage line arranged on the substrate and extending in a first direction, and a node connection line electrically connecting the thin-film transistor and the pixel electrode to each other, and including a repair portion overlapping the initial voltage line in a plan view, wherein the method includes short-circuiting the repair portion of the node connection line and the initialization voltage line to each other.

The short-circuiting of the repair portion of the node connection line and the initialization voltage line to each other may be accomplished by irradiating a laser beam to an area in which the repair portion of the node connection line and the initialization voltage line overlap each other.

Other aspects, features, and advantages other than those described above will become apparent from the accompanying drawings, the appended claims, and the detailed description of the disclosure.

These general and specific aspects may be carried out using a system, a method, a computer program, or any combinations thereof.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
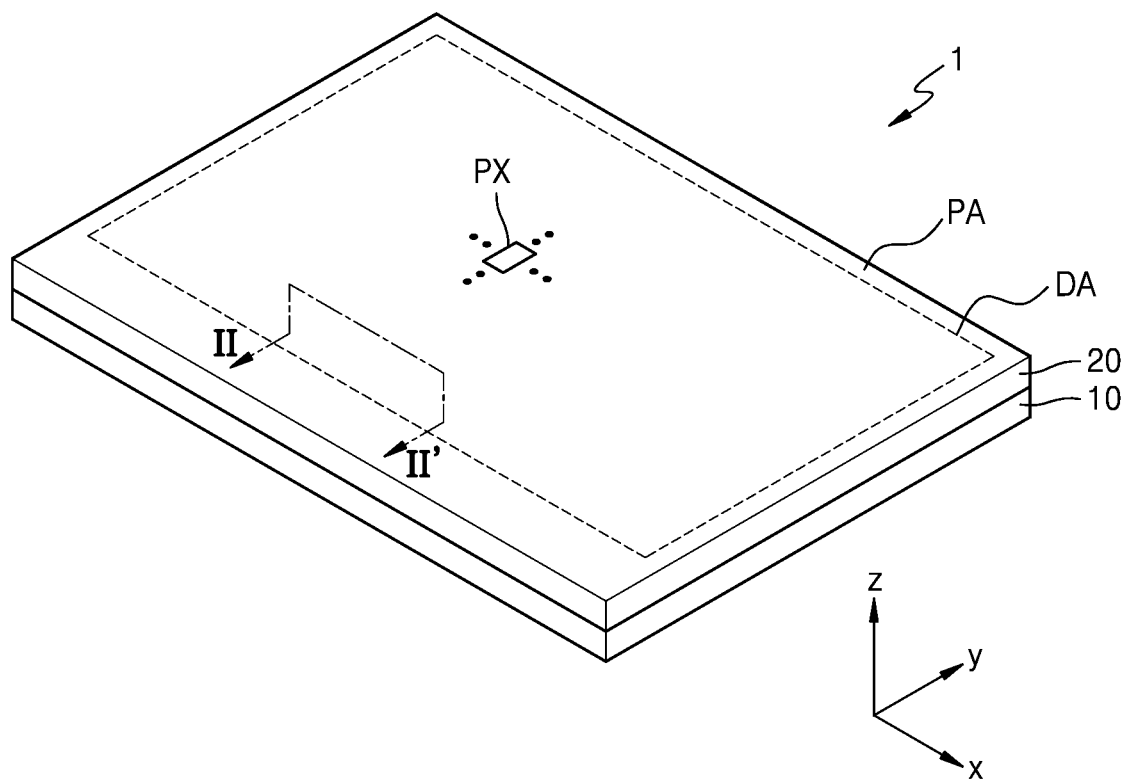
FIG. 1 is a perspective view schematically illustrating a display device according to an embodiment.

Reference will now be made in detail to embodiments, examples of which are illustrated in the accompanying drawings, wherein like reference numerals refer to like elements throughout the present disclosure. In this regard, the present embodiments may have different forms and configuration and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Because the present disclosure may have diverse modified embodiments, embodiments are illustrated in the drawings and are described with respect to the embodiments. An effect and a characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

In an embodiment below, terms such as "first" and "second" are used herein merely to describe a variety of constituent elements, but the constituent elements are not limited by the terms. Such terms are used only for the purpose of distinguishing one constituent element from another constituent element.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, area, or element is referred to as being "formed on" another layer, area, or element, it can be directly or indirectly formed on the other layer, region, or element. That is, for example, one or more intervening layers, areas, or elements may be present therebetween.

In the drawings, sizes of components in the drawings may be exaggerated or reduced for convenience of explanation. In other words, because sizes and thicknesses of components in the drawings are arbitrarily illustrated for convenience of explanation, the following embodiments are not limited thereto.

When an embodiment may be implemented differently, a certain process order may be performed differently from the described order. For example, two consecutively described processes may be performed substantially at the same time or performed in an order opposite to the described order.

In the present disclosure, the term "and/or" includes any and all combinations of one or more of the associated listed items. For example, "A and/or B" may include "A," "B," or "A and B." Throughout the present disclosure, the expression "at least one of a, b, or c" indicates only a, only b, only c, both a and b, both a and c, both b and c, all of a, b, and c, or any variations thereof.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

The x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

FIG. 1 is a perspective view schematically illustrating a display device 1 according to an embodiment.

Referring to FIG. 1, the display device 1 may include a display area DA and a peripheral area PA outside of the display area DA. The display area DA may include an area in which an image is provided. The display device 1 may provide an image through an array of a plurality of pixels PX arranged in the display area DA. Each of the pixels PX includes an area from which light of a color may be emitted, and the display device 1 may provide an image using light emitted by the pixels PX. For example, each of the pixels PX may emit red, green, or blue light.

A light-emitting element generating light and a pixel circuit for driving the light-emitting element may be arranged in the display area DA. In addition, a data line and a scan line that are electrically connected to the pixel circuit may be arranged in the display area DA.

The peripheral area PA includes an area that does not provide an image, and may entirely or partially surround the display area DA. Various power lines, signal lines, and a driving circuit which provide electrical signals or power to the pixel circuit in the display area DA may be arranged in the peripheral area PA. In addition, a pad unit to which an electronic component or a printed circuit board may be electrically connected may be arranged in the peripheral area PA.

When viewed from a direction perpendicular to one surface of the display device 1, the display device 1 may have a substantially rectangular shape. For example, as shown in FIG. 1, the display device 1 may have an overall rectangular planar shape having, for example, a long side extending in an x direction and a short side extending in a y direction. A corner at which the short side in the x direction and the long side in the y direction meet may have a right-angled shape or may have a round shape having a curvature. However, a planar shape of the display device 1 is not limited to a rectangular shape, and may include various shapes, such as a polygonal shape such as a triangular shape, a circular shape, an oval shape, an amorphous shape, or the like.

In FIG. 1, the display device 1 has a flat display surface, but the example is not limited thereto. In another embodiment, the display device 1 may include a three-dimensional display surface or a curved display surface. When the display device 1 includes the three-dimensional display surface, the display device 1 may include a plurality of display areas indicating different directions, and may include, for example, a polygonal column type display surface. In another embodiment, when the display device 1 includes the curved display surface, the display device 1 may be implemented in various forms including flexible, foldable, rollable display devices.

In some embodiments, the display device 1 may include a light-emitting unit 10 and a color unit 20 that are stacked in a thickness direction thereof (for example, a z direction). The light-emitting unit 10 may include a light-emitting element and a pixel circuit. The color unit 20 may include a color filter layer and a color-conversion-transmitting layer. This will be described in detail below, with reference to FIG. 2.

Meanwhile, the display device 1 may be used as a display screen not only in portable electronic devices, such as mobile phones, smart phones, tablet PCs, mobile communication terminals, electronic notebooks, electronic books, portable multimedia players (PMPs), navigations, and ultra mobile PCs (UMPCs), but also in various products such as televisions, laptops, monitors, billboards, and Internet of things (IoT). In addition, the display device 1 according to an embodiment may be used in wearable devices, such as smart watches, watch phones, glasses-type displays, and head mounted displays (HMDs). In addition, the display device 1 may be used as instrument panels for automobiles, center fascias for automobiles, or center information displays (CIDs) arranged on a dashboard, room mirror displays that replace side mirrors of automobiles, and displays arranged on the rear side of front seats as entertainment for rear seats of automobiles.

Figure 2:
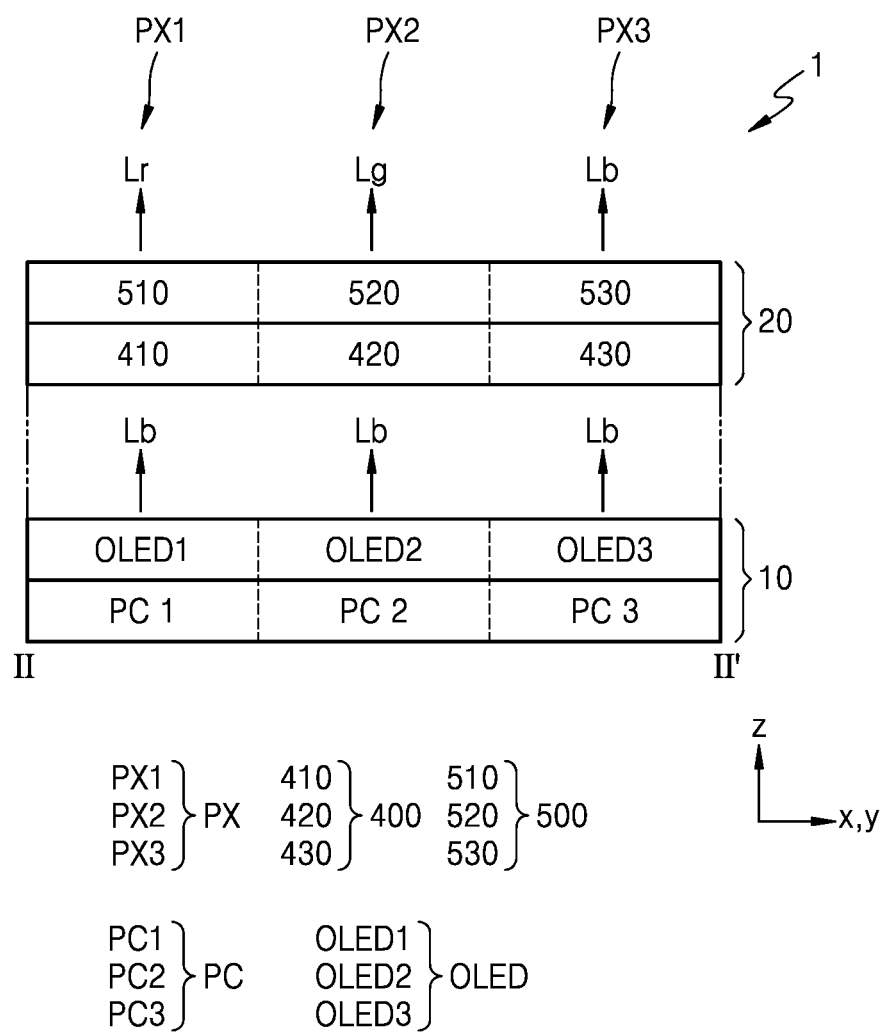
FIG. 2 is a cross-sectional view schematically illustrating a portion of a display device according to an embodiment.

FIG. 2 is a cross-sectional view schematically illustrating a portion of the display device 1 according to an embodiment. FIG. 2 may correspond to a cross-section of the display device 1 in FIG. 1, taken along line II-II' in FIG. 1.

Referring to FIG. 2, the display device 1 may include a light-emitting unit 10 and a color unit 20. The light-emitting unit 10 includes a light-emitting element generating light, and may include a plurality of organic light-emitting diodes OLED. In addition, the light-emitting unit 10 may include pixel circuits PC electrically respectively connected to the plurality of organic light-emitting diodes OLED. For example, the light-emitting unit 10 may include first, second, and third organic light-emitting diodes OLED1, OLED2, and OLED3 and first, second, and third pixel circuits PC1, PC2, and PC3 respectively connected thereto.

Each of the organic light-emitting diodes OLED of the light-emitting unit 10 may be driven by a corresponding pixel circuit PC, and may emit light toward the color unit 20. The light emitted from the light-emitting unit 10 may be implemented as light of various colors via the color unit 20.

The color unit 20 may be arranged on the light-emitting unit 10, and may include a color-conversion-transmitting layer 400 and a color filter layer 500. For example, the color-conversion-transmitting layer 400 of the color unit 20 may be arranged on a corresponding organic light-emitting diode OLED, and the color filter layer 500 may be arranged on the color-conversion-transmitting layer 400.

The color-conversion-transmitting layer 400 may include a first color-conversion unit 410, a second color-conversion unit 420, and a light-transmitting unit 430. The first color-conversion unit 410, the second color-conversion unit 420, and the light-transmitting unit 430 may be arranged to correspond to the first, second, and third organic light-emitting diodes OLED1, OLED2, and OLED3, respectively. The first color-conversion unit 410, the second color-conversion unit 420, and the light-transmitting unit 430 may convert incident light of a first color from the light-emitting unit 10 into light of a second color different from the first color, or may transmit the incident light of the first color without color conversion. In an embodiment, for example, blue light Lb may be emitted from the first, second, and third organic light-emitting diodes OLED1, OLED2, and OLED3. The blue light Lb may be converted into red light Lr or green light Lg via the color unit 20, or may be transmitted as blue light Lb without color conversion. In this case, for example, the red light Lr may include light in a wavelength band of about 580 nm to about 780 nm, the green light Lg may include light in a wavelength band of about 495 nm to about 580 nm, and the blue light Lb may include light in a wavelength band of about 400 nm to about 495 nm.

The color filter layer 500 may include a first color filter layer 510, a second color filter layer 520, and a third color filter layer 530 that selectively transmit light of different colors. The first color filter layer 510, the second color filter layer 520, and the third color filter layer 530 may be arranged to correspond to the first color-conversion unit 410, the second color-conversion unit 420, and the light-transmitting unit 430, respectively.

For example, the red light Lr, the green light Lg, and the blue light Lb which are color-converted or transmitted by the color-conversion-transmitting layer 400 may have improved color purity by passing through the first, second, and third color filter layers 510, 520, and 530, respectively, and then, may be emitted to the outside of the display device 1. An area from which the red light Lr is emitted may correspond to a first pixel PX1, an area from which the green light Lg is emitted may correspond to a second pixel PX2, and an area from which the blue light Lb is emitted may correspond to a third pixel PX3. Thus, the display device 1 may provide a full color image.

So far, an example in which a light-emitting element of the display device 1 includes an organic light-emitting diode OLED including an organic emission layer is described. However, the present disclosure is not limited thereto. In another embodiment, the light-emitting element may include an inorganic light-emitting diode including an inorganic material. The inorganic light-emitting diode may include a p-n diode including materials based on an inorganic material semiconductor. When a voltage is applied to the p-n junction diode in a forward direction, a hole and an electron are injected, and light of a color may be emitted by converting energy created due to recombination of the hole and the electron to light energy. The inorganic light-emitting diode may have a width ranging from several to hundreds of micrometers. In another embodiment, the light-emitting element may include quantum dots as an emission layer. However, in the following description, a case where the light-emitting element includes an organic light-emitting diode OLED will be mainly described, for convenience of explanation.

Figure 3:
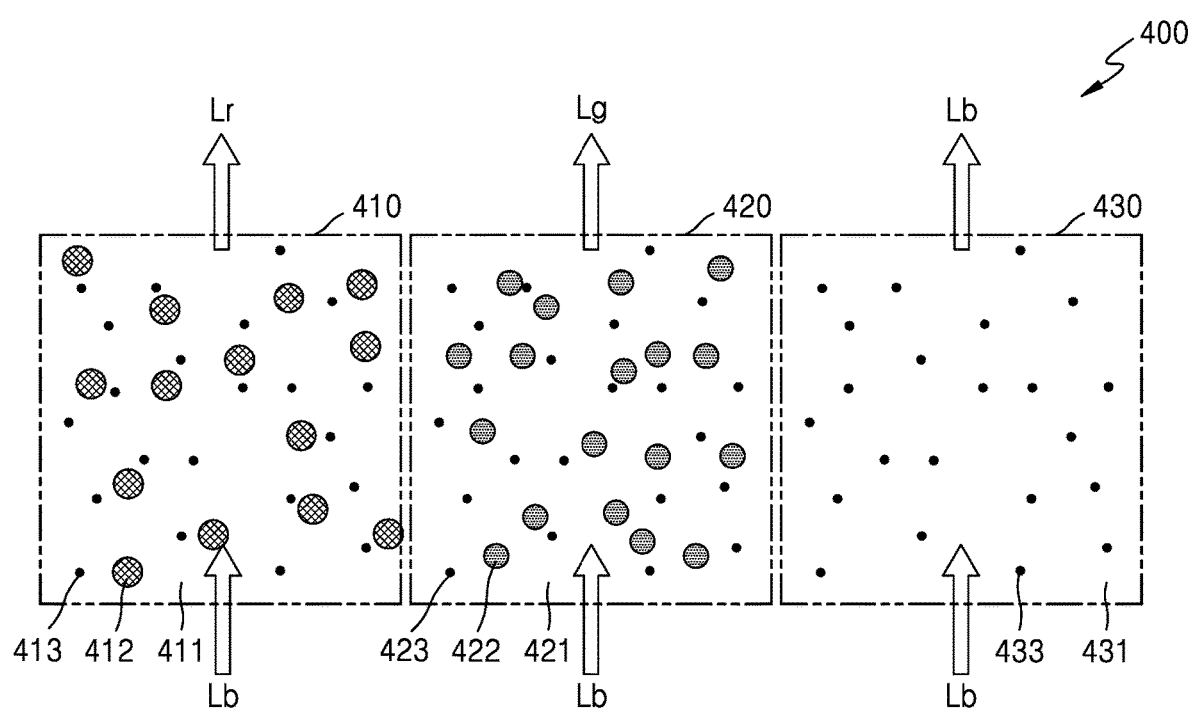
FIG. 3 is an enlarged schematic cross-sectional view of a portion of a color-conversion-transmitting layer of a display device according to an embodiment.

FIG. 3 is an enlarged schematic cross-sectional view of a portion of the color-conversion-transmitting layer 400 of a display device according to an embodiment.

Referring to FIG. 3, the color-conversion-transmitting layer 400 may include a first color-conversion unit 410, a second color-conversion unit 420, and a light-transmitting unit 430.

For example, the first color-conversion unit 410 may convert blue light Lb into red light Lr. To this end, the first color-conversion unit 410 may include a first photosensitive polymer 411 in which first quantum dots 412 are dispersed.

The first photosensitive polymer 411 is not particularly limited as long as the material has excellent dispersibility and light transmittance, but may include, for example, an acryl-based resin, an imide-based resin, or an epoxy-based resin.

The first quantum dots 412 may be excited by the blue light Lb, and may isotropically emit the red light Lr having a wavelength longer than that of the blue light Lb. In the disclosure, a quantum dot refers to a crystal of a semiconductor compound, and may include any material capable of emitting light in various wavelength bands depending on a size of the crystal.

The first quantum dots 412 may be synthesized by a wet chemical process, an organic metal chemical vapor deposition process, a molecular beam epitaxy process, or a similar process. The wet chemical process is a method of growing quantum dot particle crystals after mixing an organic solvent with a precursor material. When the crystal is grown, the organic solvent acts as a dispersant naturally coordinated on a quantum dot crystal surface, and adjusts a growth of the crystal, and thus, the wet chemical process is easier than a vapor deposition method such as metal organic chemical vapor deposition (MOCVD) or molecular beam epitaxy (MBE), and through a low-cost process, a growth of quantum particles may be controlled.

The first quantum dots 412 may include a Group III-VI semiconductor compound, a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combinations thereof.

For example, the Group III-VI semiconductor compounds may include a binary compound such as $In_2S_3$, a ternary compound such as AgInS, $AgInS_2$, CuInS, and $CuInS_2$, or any combinations thereof.

Examples of the Group II-VI semiconductor compound may include: a binary compound such as Cds, CdSe, CdTe, ZnS, ZnSe, ZnTe, ZnO, HgS, HgSe, HgTe, MgSe, and MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS; a quaternary compound such as CdZnSeS, CdZnSeTe, CdZnSTe, CdHgSeS, CdHgSeTe, CdHgSTe, HgZnSeS, HgZnSeTe, and HgZnSTe; or any combinations thereof.

Examples of the Group III-V semiconductor compound may include: a binary compound such as GaN, GaP, GaAs, GaSb, AlN, AlP, AlAs, AlSb, InN, InP, InAs, and InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and GaAlNP; a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; or any combinations thereof. Meanwhile, the Group III-V semiconductor compound may further include a Group II element. Examples of the Group III-V semiconductor compound further including the Group II element may include InZnP, InGaZnP, InAlZnP, or the like.

Examples of the Group III-VI semiconductor compound may include: a binary compound such as GaS, GaSe, $Ga_2Se_3$, GaTe, InS, InSe, $In_2Se_3$, and InTe; a ternary compound such as $InGaS_3$ and $InGaSe_3$; or any combinations thereof.

Examples of the Group I-III-VI semiconductor compound may include a ternary compound such as AgInS, $AgInS_2$, CuInS, $CuInS_2$, $CuGaO_2$, $AgGaO_2$, and $AgAlO_2$, or any combinations thereof.

Examples of the Group IV-VI semiconductor compound may include: a binary compound such as SnS, SnSe, SnTe, PbS, PbSe, and PbTe; a ternary compound such as SnSeS, SnSeTe, SnSTe, PbSeS, PbSeTe, PbSTe, SnPbS, SnPbSe, and SnPbTe; a quaternary compound such as; SnPbSSe, SnPbSeTe, and SnPbSTe; or any combinations thereof.

The Group IV element or compound may include: a single element compound such as Si and Ge; a binary compound such as SiC and SiGe; or any combinations thereof.

Each of elements included in the multi-element compound, such as the binary compound, the ternary compound, and the quaternary compound, may be present in a particle in a uniform or non-uniform concentration.

Meanwhile, the first quantum dots 412 may have a single structure or a core-shell dual structure in which a concentration of each element included in the corresponding quantum dot is uniform. For example, a material included in the core and a material included in the shell may be different from each other.

The shell may serve as a protective layer for maintaining semiconductor properties by preventing chemical modification of the core and/or as a charging layer for imparting electrophoretic properties to quantum dots. The shell may include a single layer or multiple layers. An interface between the core and the shell may have a concentration gradient in which the concentration of elements in the shell decreases toward the center of the core.

Examples of the shell may include a metal or non-metal oxide, a semiconductor compound, or any combinations thereof. Examples of the metal or non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; a ternary compound such as $MgAl_2O_4$, $CoFe_2O_4$, $NiFe_2O_4$, $CoMn_2O_4$; or any combinations thereof. Examples of the semiconductor compound may include: a Group III-VI semiconductor compound; a Group II-VI semiconductor compound; a Group III-V semiconductor compound; a Group III-VI semiconductor compound; a Group I-III-VI semiconductor compound; a Group IV-VI semiconductor compound; or any combinations thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combinations thereof.

The first quantum dots 412 may have a full width of half maximum (FWHM) of an emission wavelength spectrum in a range of about 45 nm or less, for example, about 40 nm or less, and for example, about 30 nm or less. Color purity or color reproducibility may be improved in this range. Also, because light emitted from the first quantum dots 412 is emitted in all directions, an optical viewing angle may be improved.

In addition, a shape of the first quantum dots 412 is specifically spherical, pyramidal, multi-arm, or cubic nanoparticles, nanotubes, nanowires, nanofibers, nanoplatelet particles, etc. First scattering particles 413 may be further dispersed in the first photosensitive polymer 411. The first scattering particles 413 may allow more first quantum dots 412 to be excited by scattering the blue light Lb that is not absorbed by the first quantum dots 412. Thus, the color-conversion efficiency of the first color-conversion unit 410 may be increased. In addition, the first scattering particles 413 may scatter light in various directions regardless of an incident angle without substantially converting a wavelength of the incident light. Thus, side visibility may be improved.

The first scattering particles 413 may include a particle having a refractive index different from that of the first photosensitive polymer 411, for example, a light-scattering particle. The first scattering particles 413 are not particularly limited as long as the material may form an optical interface with the first photosensitive polymer 411 and partially scatter transmissive light, but may include, for example, metal oxide particles or organic particles. For example, the metal oxide may include titanium oxide ($TiO_2$), zirconium dioxide ($ZrO_2$), aluminum oxide ($Al_2O_3$), indium oxide ($In_2O_3$), zinc oxide (ZnO), or tin oxide ($SnO_2$), and the organic materials may include an acryl-based resin or a urethane-based resin. The second color-conversion unit 420 may convert the blue light Lb into the green light Lg. The second color-conversion unit 420 may include a second photosensitive polymer 421 in which second quantum dots 422 are dispersed, and second scattering particles 423 are dispersed together with the second quantum dots 422 in the second photosensitive polymer 421, thus increasing a color conversion rate of the second color-conversion unit 420.

The second photosensitive polymer 421 and the first photosensitive polymer 411 may include the same material, and the second scattering particles 423 and the first scattering particles 413 may include the same material.

The second quantum dots 422 may include the same material as the first quantum dots 412, and may have the same shape as the first quantum dots 412. However, a size of the second quantum dots 422 may be less than a size of the first quantum dots 412. This is to allow the second quantum dots 422 to emit light in a wavelength band different from that of the first quantum dots 412. For example, an energy band gap may be adjusted by adjusting a size of quantum dots, and thus, light in various wavelength bands may be obtained. The second quantum dots 422 have a size less than that of the first quantum dots 412, and thus, the second quantum dots 422 are excited by the blue light Lb and have a wavelength longer than that of the blue light Lb, and may isotropically emit the green light Lg having a wavelength shorter than that of the red light Lr. The light-transmitting unit 430 may include a third photosensitive polymer 431 in which third scattering particles 433 are dispersed. In other words, the light-transmitting unit 430 does not include an additional quantum dot that may be excited by the blue light Lb. Meanwhile, like the first photosensitive polymer 411, the third photosensitive polymer 431 may include an organic material having a light transmittance, and the third scattering particles 433 may include the same material as the first scattering particles 413. Thus, blue light Lb incident on the light-transmitting unit 430 may transmit the light-transmitting unit 430 without color change, and thus, light emitted through the light-transmitting unit 430 may be blue light Lb. However, the blue light Lb may be scattered by the third scattering particles 433 within the light-transmitting unit 430, and may be emitted to the outside. The light-transmitting unit 430 may transmit the blue light Lb incident thereon without color change, thus obtaining improved light efficiency.

Figure 4A:
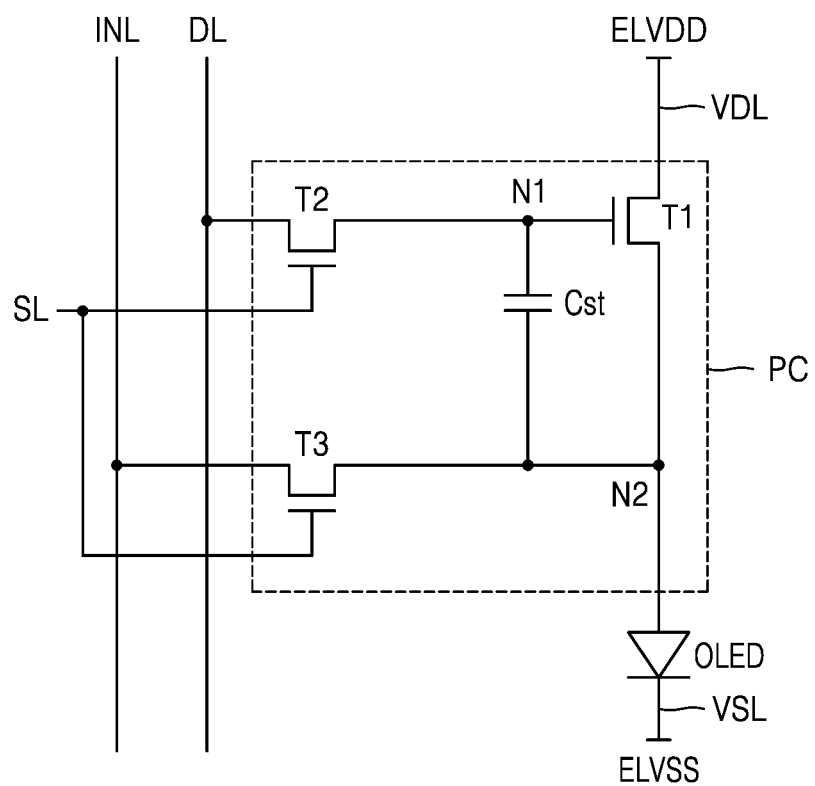
FIG. 4A is an equivalent circuit diagram of a pixel circuit provided in a display device according to an embodiment.
Figure 4B:
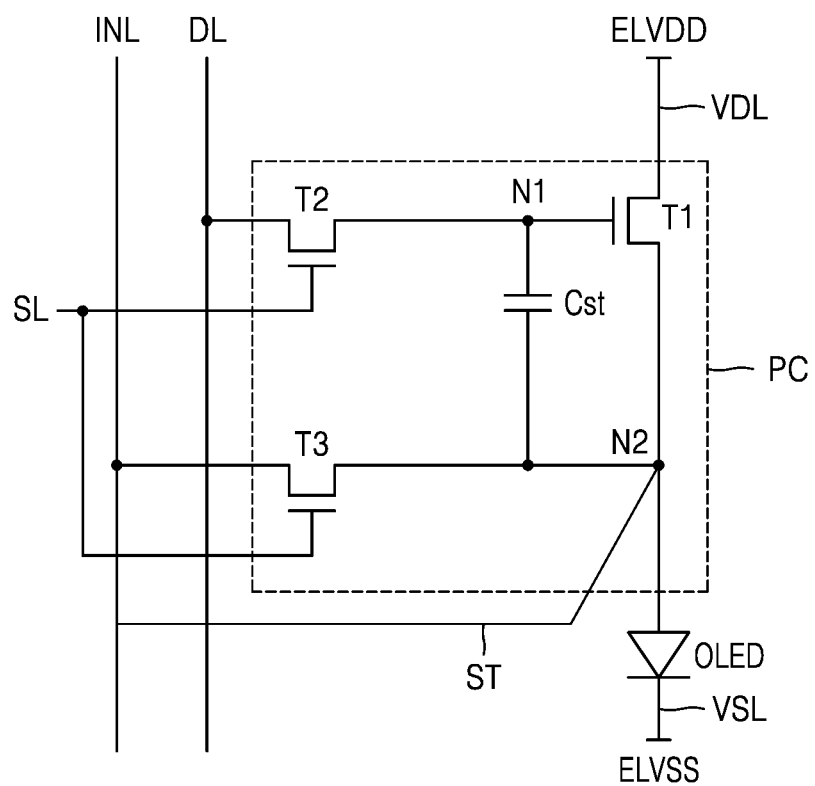
FIG. 4B is an equivalent circuit diagram of a pixel circuit after a process of repairing of a display device is performed, according to an embodiment.

FIG. 4A is an equivalent circuit diagram of a pixel circuit PC provided in a display device according to an embodiment. FIG. 4B is an equivalent circuit diagram of the pixel circuit PC after a process of repairing of a display device is performed, according to an embodiment.

Firstly, referring to FIG. 4A, the pixel circuit PC may include a plurality of thin-film transistors and at least one capacitor. In an embodiment, the pixel circuit PC may include a first thin-film transistor T1, a second thin-film transistor T2, a third thin-film transistor T3, and a storage capacitor Cst.

Each of the first thin-film transistor T1, the second thin-film transistor T2, and the third thin-film transistor T3 may include an oxide semiconductor thin-film transistor including a semiconductor layer including an oxide semiconductor, or may include a silicon semiconductor thin-film transistor including a semiconductor layer including polysilicon. Each of the first, second, and third thin-film transistors T1, T2, and T3 may include a first electrode and a second electrode, and the first electrode may be one of a source electrode and a drain electrode, and the second electrode may be the other one of the source electrode and the drain electrode, depending on a type of the thin-film transistor. In addition, each of the first, second, and third thin-film transistors T1, T2, and T3 may include a gate electrode.

The first thin-film transistor T1 may include a driving thin-film transistor. The first electrode of the first thin-film transistor T1 may be connected to a driving voltage line VDL for applying a driving power voltage ELVDD, and the second electrode of the first thin-film transistor T1 may be connected to a pixel electrode of an organic light-emitting diode OLED. The gate electrode of the first thin-film transistor T1 may be connected to a first node N1. The first thin-film transistor T1 may control an amount of current flowing from the driving power voltage ELVDD through the organic light-emitting diode OLED in response to a voltage of the first node N1.

The second thin-film transistor T2 may include a switching thin-film transistor. The first electrode of the second thin-film transistor T2 may be connected to a data line DL, and the second electrode of the second thin-film transistor T2 may be connected to the first node N1. The gate electrode of the second thin-film transistor T2 may be connected to a scan line SL. When a scan signal is transmitted to the scan line SL, the second thin-film transistor T2 may be turned on, and may electrically connect the data line DL and the first node N1 to each other.

The third thin-film transistor T3 may include an initialization thin-film transistor and/or a sensing thin-film transistor. The first electrode of the third thin-film transistor T3 may be connected to a second node N2, and the second electrode of the third thin-film transistor T3 may be connected to an initialization voltage line INL. The gate electrode of the third thin-film transistor T3 may be connected to the scan line SL.

The third thin-film transistor T3 may be turned on when a scan signal is transmitted to the scan line SL, and may electrically connect the initialization voltage line INL and the second node N2 to each other. In some embodiments, the third thin-film transistor T3 may be turned on according to a signal received via the scan line SL, and may initialize the pixel electrode of the organic light-emitting diode OLED by using an initialization voltage from the initialization voltage line INL.

In some embodiments, the third thin-film transistor T3 may be turned on when a scan signal is transmitted to the scan line SL, to sense characteristic information of the organic light-emitting diode OLED. The third thin-film transistor T3 may have both a function of the initialization thin-film transistor and a function of the sensing thin-film transistor, or may have a function of either one. An initialization operation and a sensing operation of the third thin-film transistor T3 may be performed individually or simultaneously. When the third thin-film transistor T3 has the function of the sensing thin-film transistor, the initialization voltage line INL may be referred to as a sensing line.

The storage capacitor Cst may be connected between the first node N1 and the second node N2. For example, a first capacitor plate of the storage capacitor Cst may be connected to the gate electrode of the first thin-film transistor T1, and a second capacitor plate of the storage capacitor Cst may be connected to the pixel electrode of the organic light-emitting diode OLED.

An opposite electrode of the organic light-emitting diode OLED may be connected to a common voltage line VSL for providing a common power voltage ELVSS.

In FIG. 4, the pixel circuit PC includes three thin-film transistors and one storage capacitor, but the present disclosure is not limited thereto. In another embodiment, the number of thin-film transistors and the number of storage capacitors may be variously modified depending on the design of the pixel circuit PC.

Meanwhile, in a process of manufacturing the display device 1 (see FIG. 1), a defect may occur in some pixel circuits PC. For example, a defect in which the first thin-film transistor T1 may be shorted may occur due to a foreign material or a process error. In this case, the organic light-emitting diode OLED may always receive the driving power voltage ELVDD regardless of a scan signal and a data signal, and thus, may always emit light. As the organic light-emitting diode OLED always emits light, a corresponding pixel PX (see FIG. 1) may always be recognized as a bright spot to a user. In general, when at least one such bright spot is present in the display device 1, the display device 1 may be treated as defective as a whole (this defect is hereinafter referred to as a bright spot defect).

Referring to FIG. 4B, a bright spot may be changed to a dark spot by repairing a pixel circuit PC having a defect. As described above, when at least one defective bright spot is present in the display device 1, the display device 1 is treated as defective as a whole, but a predetermined number of dark spots present in the display device 1 may be allowed.

In an embodiment, the initialization voltage line INL and the second node N2 may be shorted in the pixel circuit PC having a defect. Unlike FIG. 4A, FIG. 4B shows a short-circuit path ST disposed between the initialization voltage line INL and the second node N2. In this case, an initialization voltage may always be applied to the second node N2 that is directly connected to the initialization voltage line INL. The initialization voltage line INL transfers an initialization voltage (for example, about 2 volts), which is less than a voltage for illuminating the organic light-emitting diode OLED (for example, about 8 volts), and thus, the organic light-emitting diode OLED does not always emit light regardless of a data signal and a scan signal, and a corresponding pixel PX may include a dark spot.

As described above, a defective bright spot may be changed to a dark spot through repair of the pixel circuit PC, thus reducing treatment of the entire display device 1 as defective. Thus, the productivity and yield of the display device 1 may increase.

Figure 5:
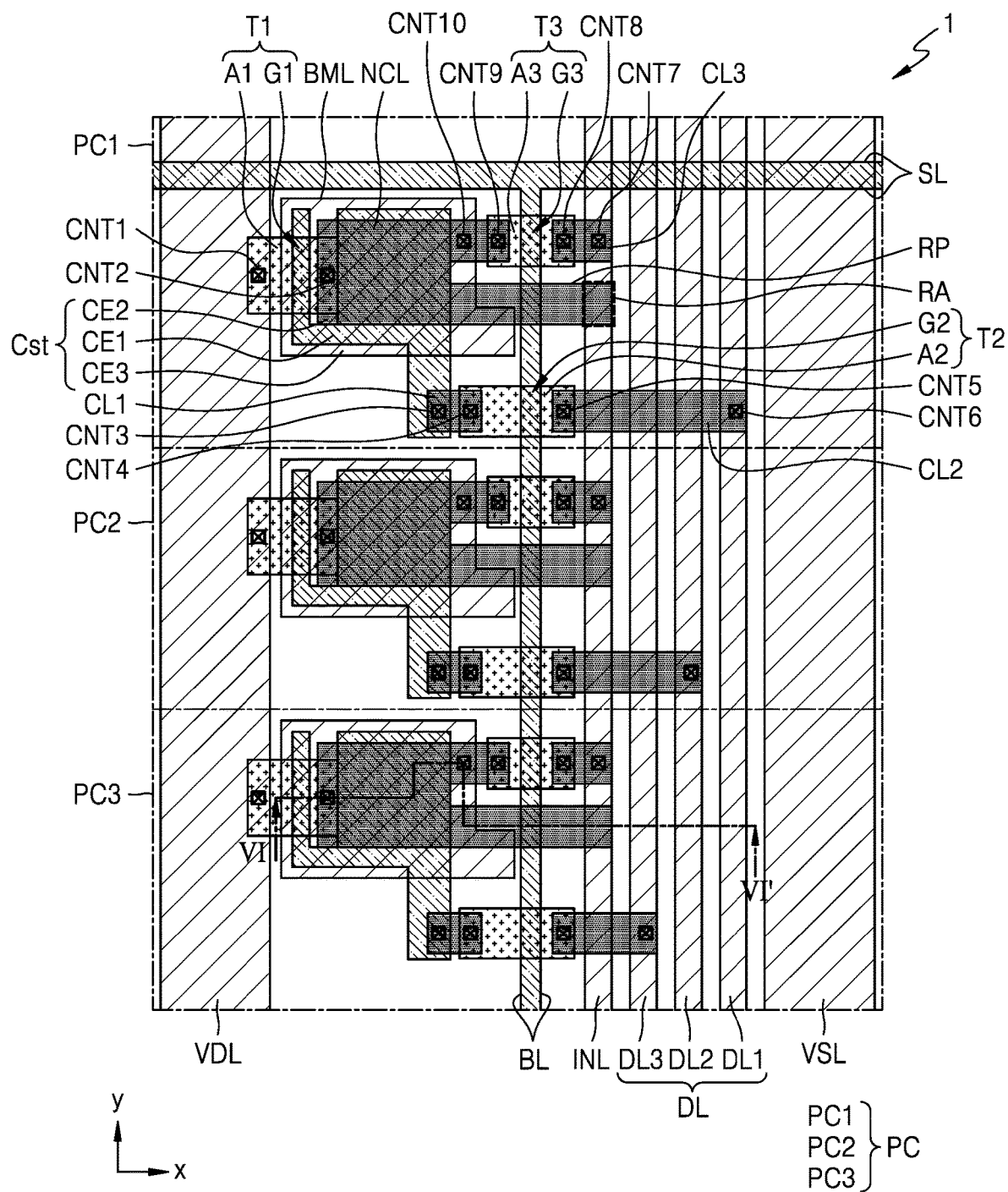
FIG. 5 is a plan view schematically illustrating a portion of a display device according to an embodiment.

FIG. 5 is a plan view schematically illustrating pixel circuits provided in a display device 1 according to an embodiment.

Referring to FIG. 5, the display device 1 may include a plurality of pixel circuits PC. For example, the display device 1 may include first, second, and third pixel circuits PC1, PC2, and PC3. In addition, the display device 1 may include various lines electrically connected to each of the pixel circuits PC, for example, a scan line SL, a plurality of data lines DL, a branch line BL, an initialization voltage line INL, a driving voltage line VDL, and a common voltage line VSL.

In an embodiment, for example, the scan line SL may extend in an x direction, and the plurality of data lines DL may extend in a y direction crossing the x direction. The branch line BL may extend in the y direction from the scan line SL. Each of the initialization voltage line INL, the driving voltage line VDL, and the common voltage line VSL may extend in the y direction.

In some embodiments, the driving voltage line VDL and the common voltage line VSL are spaced apart from each other, and the plurality of data lines DL may be arranged between the driving voltage line VDL and the common voltage line VSL. The plurality of data lines DL may include, for example, first to third data lines DL1, DL2, and DL3, and the first, second, and third data lines DL1, DL2, and DL3 may be arranged adjacent to each other and adjacent to the common voltage line VSL. The first, second, and third data lines DL1, DL2, and DL3 may apply independent data signals to the first, second, and third pixel circuits PC1, PC2, and PC3, respectively.

In an embodiment, the initialization voltage line INL and the branch line BL may be arranged between the driving voltage line VDL and the common voltage line VSL. The initialization voltage line INL may be arranged between a first thin-film transistor T1 to be described later, and the data line DL. The branch line BL may be arranged at an opposite side to the data line DL with respect to the initialization voltage line INL. For example, the branch line BL may be integrally formed as a single body with the scan line SL, and may transfer a scan signal together with the scan line SL.

The arrangement of the first, second, and third data lines DL1, DL2, and DL3, the initialization voltage line INL, and the branch line BL in FIG. 5 is only an example, and the present disclosure is not limited thereto, and the arrangement may be appropriately changed and modified according to the design of the pixel circuit PC.

The display device 1 may include a structure in which the structure shown in FIG. 5 is repeated in the x direction and the y direction. Thus, a plurality of scan lines SL and a plurality of driving voltage lines VDL provided in the display device 1 may form a mesh structure in a plan view. Likewise, the plurality of scan lines SL and a plurality of common voltage lines VSL may form a mesh structure in a plan view. Here, the expression "in a plan view" may refer to "on a virtual plane parallel to the substrate 100 (see FIG. 6) of the display device 1."

A plurality of thin-film transistors, for example, first, second, and third thin-film transistors T1, T2, and T3, and a storage capacitor Cst may be arranged in a space surrounded by the scan lines SL adjacent to each other in a plan view, the driving voltage line VDL, and the common voltage line VSL. The plurality of thin-film transistors, for example, the first, second, and third thin-film transistors T1, T2, and T3, and the storage capacitor Cst may be included in one pixel circuit PC. For example, the first to third pixel circuits PC1, PC2, and PC3 shown in FIG. 5 may include the first to third thin-film transistors T1, T2, and T3, respectively, and may each include the storage capacitor Cst. Hereinafter, for convenience of explanation, a structure and arrangement of the plurality of thin-film transistors, for example, first, second, and third thin-film transistors T1, T2, and T3, and the storage capacitor Cst provided in the first pixel circuit PC1 will be mainly described. The second pixel circuit PC2 and the third pixel circuit PC3 have the same structure and arrangement as the first pixel circuit PC1 described above, except that the second pixel circuit PC2 and the third pixel circuit PC3 are respectively connected to the second data line DL2 and the third data line DL3. Thus, redundant descriptions of the second pixel circuit PC2 and the third pixel circuit PC3 will be omitted.

Each of the thin-film transistors, for example, the first, second, and third thin-film transistors T1, T2, and T3, of the first pixel circuit PC1 may include a semiconductor layer and a gate electrode overlapping at least a portion of the semiconductor layer.

The first thin-film transistor T1 may include a first semiconductor layer A1 and a first gate electrode G1 overlapping at least a portion of the first semiconductor layer A1. The first semiconductor layer A1 may include an oxide semiconductor or a silicon-based semiconductor. The first semiconductor layer A1 may include a channel area, and a source area and a drain area respectively arranged at opposite sides of the channel area. The source area and the drain area are areas having a lower resistance than the channel area, and may be formed through a doping process or a conductorization process of impurities. The source area and the drain area may correspond to a source electrode and a drain electrode of each thin-film transistor, respectively. Hereinafter, for convenience of explanation, terms "a source area" and "a drain area" are used instead of "a source electrode" or "a drain electrode." A first gate electrode G1 may overlap the channel area of a first semiconductor layer A1.

In the first semiconductor layer A1, one of the source area and the drain area may be electrically connected to the driving voltage line VDL through a first contact hole CNT1, and the other one may be electrically connected to the storage capacitor Cst through a second contact hole CNT2. For example, the first semiconductor layer A1 may be connected to a second capacitor plate CE2 of the storage capacitor Cst through the second contact hole CNT2.

The second thin-film transistor T2 may include a second semiconductor layer A2 and a second gate electrode G2 overlapping at least a portion of the second semiconductor layer A2. The second semiconductor layer A2 may include an oxide semiconductor or a silicon-based semiconductor. The second semiconductor layer A2 may include a channel area, and a source area and a drain area respectively arranged at opposite sides of the channel area. The second gate electrode G2 may overlap the channel area of the second semiconductor layer A2. The second gate electrode G2 may correspond to a portion of the scan line SL or a portion of the branch line BL extending in the y direction from the scan line SL as shown in FIG. 5.

One of the source area and the drain area of the second semiconductor layer A2 may be electrically connected to the storage capacitor Cst, and the other one may be electrically connected to the data line DL. For example, the second semiconductor layer A2 may be connected to a first connection line CL1 through a fourth contact hole CNT4, and the first connection line CL1 may be connected to a first capacitor plate CE1 of the storage capacitor Cst through a third contact hole CNT3. In addition, the second semiconductor layer A2 may be connected to a second connection line CL2 through a fifth contact hole CNT5, and the second connection line CL2 may be connected to the first data line DL1 through a sixth contact hole CNT6.

The third thin-film transistor T3 may include a third semiconductor layer A3 and a third gate electrode G3 overlapping at least a portion of the third semiconductor layer A3. The third semiconductor layer A3 may include an oxide semiconductor or a silicon-based semiconductor. The third semiconductor layer A3 may include a channel area and a source area and a drain area respectively arranged at opposite sides of the channel area. The third gate electrode G3 may overlap the channel area of the third semiconductor layer A3. The third gate electrode G3 may correspond to a portion of the scan line SL or a portion of the branch line BL extending in the y direction from the scan line SL as shown in FIG. 5.

One of the source area and the drain area of the third semiconductor layer A3 may be electrically connected to the initialization voltage line INL, and the other one may be electrically connected to the storage capacitor Cst. For example, the third semiconductor layer A3 may be connected to a third connection line CL3 through an eighth contact hole CNT8, and the third connection line CL3 may be connected to the initialization voltage line INL through a seventh contact hole CNT7. In addition, the third semiconductor layer A3 may be connected to the second capacitor plate CE2 of the storage capacitor Cst through a ninth contact hole CNT9.

The storage capacitor Cst may include at least two capacitor plates that overlap each other. In an embodiment, the storage capacitor Cst may include the first capacitor plate CE1 and the second capacitor plate CE2 overlapping each other. In some embodiments, the storage capacitor Cst may further include a third capacitor plate CE3 that overlaps the first capacitor plate CE1 and the second capacitor plate CE2.

The first capacitor plate CE1 may be integrally provided as a single body with the first gate electrode G1. In other words, a portion of the first capacitor plate CE1 may correspond to the first gate electrode G1. The second capacitor plate CE2 may be arranged on the first capacitor plate CE1 in a cross-sectional view, and may correspond to a portion of a node connection line NCL. In other words, the node connection line NCL may include the second capacitor plate CE2. The third capacitor plate CE3 may be arranged below the first capacitor plate CE1 in a cross-sectional view, and may correspond to a portion of a bottom metal layer BML. In other words, the bottom metal layer BML may include the third capacitor plate CE3. The second capacitor plate CE2 may be electrically connected to the third capacitor plate CE3 through a tenth contact hole CNT10. Here, the expression "in a cross-sectional view" may refer to "on a virtual plane perpendicular to a substrate 100 (see FIG. 6) of the display device 1."

The node connection line NCL may electrically connect the first thin-film transistor T1 with a pixel electrode of an organic light-emitting diode. For example, the node connection line NCL may be connected to the first thin-film transistor T1 through the second contact hole CNT2, and although not shown in FIG. 5, a pixel electrode 210 (see FIG. 6) of an organic light-emitting diode OLED (see FIG. 6) may be connected to the node connection line NCL through a contact hole and/or a connection electrode. In addition, the node connection line NCL may be electrically connected to the third thin-film transistor T3. For example, the node connection line NCL may be connected to the third thin-film transistor T3 through the ninth contact hole CNT9. The node connection line NCL may correspond to the second node N2 in FIGS. 4A and 4B described above.

In an embodiment, the node connection line NCL may include not only the second capacitor plate CE2 of the storage capacitor Cst, but also a repair portion RP. At least a portion of the repair portion RP may overlap the initialization voltage line INL in a cross-sectional view. For example, the repair portion RP of the node connection line NCL may extend in the x direction crossing the y direction, which is an extension direction of the initialization voltage line INL, and may overlap the initialization voltage line INL. That is, the repair portion RP of the node connection line NCL overlaps at least a portion of the initialization voltage line INL. An area in which the repair portion RP and the initialization voltage line INL overlap each other in a plan view may be defined as a repair area RA.

According to an embodiment, when a defect occurs in the first pixel circuit PC1, the repair portion RP of the node connection line NCL and the initialization voltage line INL may be shorted to each other. For example, by irradiating a laser beam to the repair area RA in which the repair portion RP and the initialization voltage line INL overlap each other, the repair portion RP and the initialization voltage line INL may be shorted to each other. In this case, the initialization voltage line INL may not go through the third thin-film transistor T3, but may apply an initialization voltage to the pixel electrode 210 of the organic light-emitting diode OLED. Accordingly, the organic light-emitting diode OLED may not always emit light, and a corresponding pixel PX may include a dark spot. Thus, a bright spot defect may be resolved.

In a comparative example, a laser beam may be irradiated to a plurality of areas to resolve a bright spot defect. For example, by irradiating a laser beam to various areas, a process in which some lines are opened and other lines are shorted may be performed.

However, according to an embodiment, a laser beam is irradiated only to a single area, thereby resolving a bright spot defect. Thus, a repair process time may be reduced, and a repair success rate may be improved. Thus, the productivity and yield of the display device 1 may be improved. In addition, according to an embodiment, it is not necessary to open lines of the pixel circuit PC for repair. Accordingly, it is unnecessary to ensure a space margin for opening when designing the pixel circuit PC, and thus, design restrictions are minimized, thereby improving the degree of integration and resolution of the display device 1.

Meanwhile, according to an embodiment, the initialization voltage line INL may be arranged closer to the first, second, and third thin-film transistors T1, T2, and T3 than the data line DL in a plan view. For example, the initialization voltage line INL may be arranged closer to the first thin-film transistor T1 than the first, second, and third data lines DL1, DL2, and DL3 in a plan view. The node connection line NCL may not overlap the data line DL in a plan view. For example, the repair portion RP of the node connection line NCL extends in the x direction, but only up to an area in which the initialization voltage line INL is arranged. Thus, the repair portion RP of the node connection line NCL may overlap only the initialization voltage line INL, and not the data line DL. Thus, the occurrence of parasitic capacitance and coupling between the node connection line NCL and the data line DL may be minimized.

Hereinafter, a stacked structure of the display device 1 will be described with reference to FIG. 6.

Figure 6:
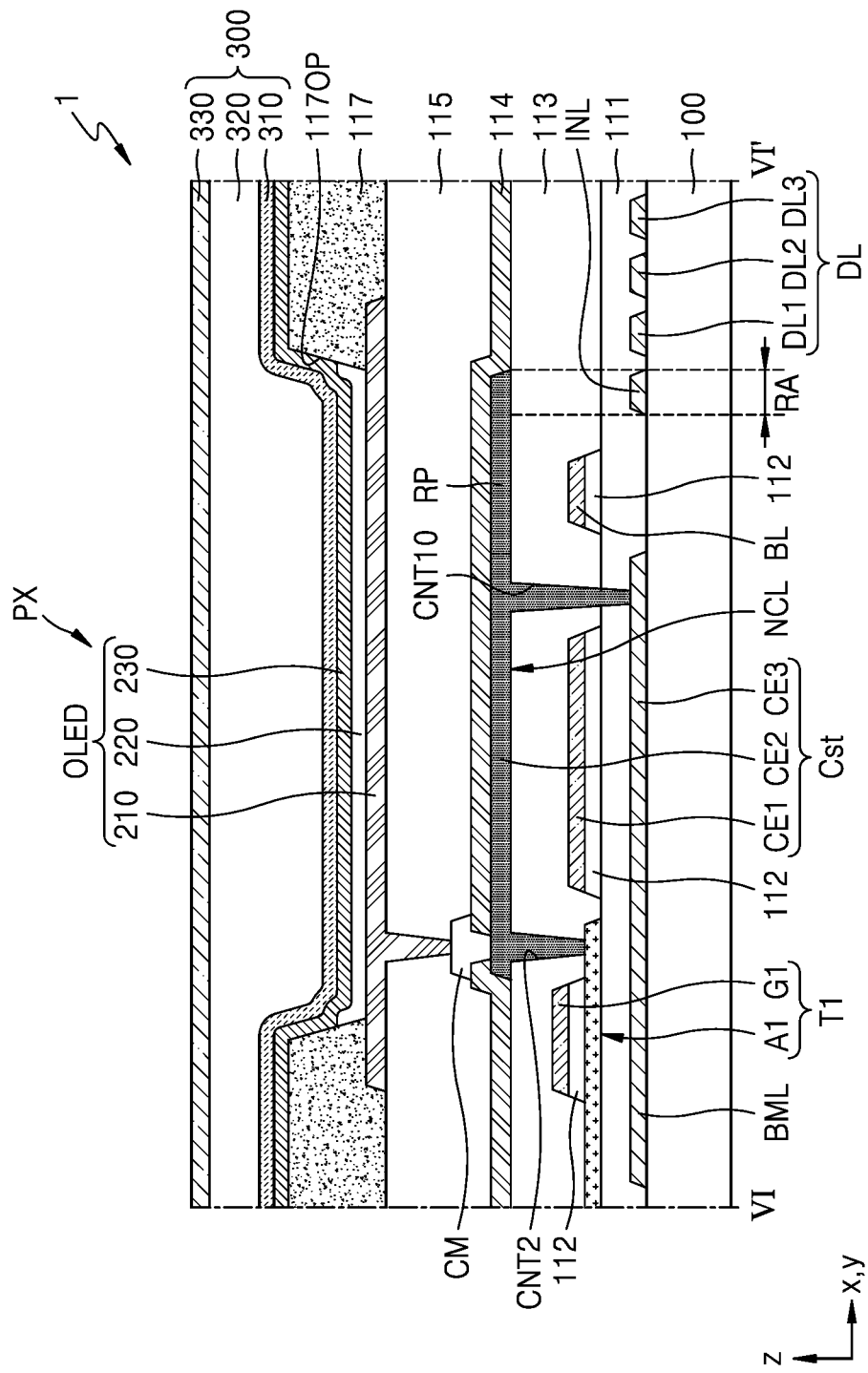
FIG. 6 is a cross-sectional view schematically illustrating a portion of a display device according to an embodiment.

FIG. 6 is a cross-sectional view schematically illustrating a portion of the display device 1 in FIG. 5 according to an embodiment, taken along line VI-VI' in FIG. 5.

Referring to FIG. 6, the display device 1 may include the substrate 100, and various elements of the display device 1 to be described later may be arranged on the substrate 100.

The substrate 100 may include glass, a metal, or a polymer resin. When the substrate 100 is flexible or bendable, the substrate 100 may include a polymer resin such as, for example, polyethersulfone, polyacrylate, polyetherimide, polyethylene naphthalate, polyethylene terephthalate, polyphenylene sulfide, polyarylate, polyimide, polycarbonate, or cellulose acetate propionate. However, the substrate 100 may have a multi-layer structure including two layers each including the polymer resin described above and a barrier layer including an inorganic material (such as silicon oxide, silicon nitride, or silicon oxynitride), between the layers, and various modifications may be made.

A plurality of thin-film transistors may be arranged on the substrate 100. FIG. 6 shows a cross-section of the first thin-film transistor T1 as an example, and hereinafter, for convenience of explanation, a stacked structure of a thin-film transistor in a cross-sectional view will be described with a focus on the first thin-film transistor T1. A stacked structure of the second and third thin-film transistors T2 and T3 (see FIG. 5) in a cross-sectional view may be same or similar as or to that of the first thin-film transistor T1.

The first thin-film transistor T1 may include the first semiconductor layer A1 and the first gate electrode G1 overlapping at least portion of the first semiconductor layer A1.

The first semiconductor layer A1 of the first thin-film transistor T1 may include, for example, an oxide semiconductor. The oxide semiconductor may include indium gallium zinc oxide (IGZO), zinc tin oxide (ZTO), zinc indium oxide (ZIO), or the like. In another example, the first semiconductor layer A1 may include polysilicon, amorphous silicon, or an organic semiconductor.

The first gate electrode G1 of the first thin-film transistor T1 may overlap the channel area of the first semiconductor layer A1 with a gate insulating layer 112 therebetween. The first gate electrode G1 may include, for example, a conductive material including molybdenum (Mo), aluminum (Al), copper (Cu), titanium (Ti), or the like, and may be provided as multiple layers or a single layer including the materials described above. In some embodiments, the first gate electrode G1 may have a multi-layer structure of a metal layer including the metal elements described above, and a transparent conductive oxide layer including ITO, on the metal layer.

The first capacitor plate CE1 of the storage capacitor Cst may be formed in the same process as the first gate electrode G1, and may include the same material as the first gate electrode G1. In addition, the branch line BL and the scan line SL (see FIG. 5) integrally provided as a single body with the branch line BL may be formed in the same process as the first gate electrode G1, and may include the same material as the first gate electrode G1.

The gate insulating layer 112 may be arranged below the first gate electrode G1, the first capacitor plate CE1, and the branch line BL. The gate insulating layer 112 may be formed in the same mask process as the first gate electrode G1, the first capacitor plate CE1, and the branch line BL. Thus, the gate insulating layer 112 may have a planar shape that is substantially same as those of the first gate electrode G1, the first capacitor plate CE1, and the branch line BL. For example, the gate insulating layer 112 may include an inorganic material such as silicon oxide, silicon nitride, and/or silicon oxynitride.

The bottom metal layer BML may be disposed between the substrate 100 and the first semiconductor layer A1 of the first thin-film transistor T1. For example, the bottom metal layer BML may be arranged directly on an upper surface of the substrate 100. The bottom metal layer BML may include one or more materials from among Al, platinum (Pt), palladium (Pd), silver (Ag), magnesium (Mg), gold (Au), nickel (Ni), neodymium (Nd), iridium (Ir), chromium (Cr), lithium (Li), calcium (Ca), Mo, and Cu. In some embodiments, the bottom metal layer BML may include a light-shielding material. The bottom metal layer BML may overlap the first thin-film transistor T1. In some embodiments, a constant voltage or a signal may be applied to the bottom metal layer BML. The bottom metal layer BML may improve and/or stabilize characteristics of the first thin-film transistor T1.

In an embodiment, the bottom metal layer BML may include the third capacitor plate CE3 of the storage capacitor Cst. In other words, the third capacitor plate CE3 of the storage capacitor Cst may be provided as a portion of the bottom metal layer BML. Thus, a space may be used efficiently, and a degree of integration of the display device 1 may be improved.

In an embodiment, the data lines DL and the initialization voltage line INL may be arranged on the substrate 100. The data lines DL and the initialization voltage line INL may be formed in the same process as the bottom metal layer BML, and may include the same material as the bottom metal layer BML. In addition, although not shown in FIG. 6, the driving voltage line VDL (see FIG. 5) and the common voltage line VSL (see FIG. 5) may also be formed in the same process as the bottom metal layer BML, and may include the same material as the bottom metal layer BML.

A buffer layer 111 may be arranged on the bottom metal layer BML, the data lines DL, and the initialization voltage line INL. In other words, the buffer layer 111 may be disposed between the bottom metal layer BML and the first thin-film transistor T1, and may cover the bottom metal layer BML, the data lines DL, and the initialization voltage line INL. The buffer layer 111 may improve a flatness of the upper surface of the substrate 100, and may prevent impurities from the substrate 100 or the like from penetrating into the first semiconductor layer A1. For example, the buffer layer 111 may include an inorganic material such as silicon oxide, silicon nitride, and/or silicon oxynitride.

An interlayer insulating layer 113 may be arranged on the buffer layer 111. The interlayer insulating layer 113 may cover the first gate electrode G1 of the first thin-film transistor T1, the first capacitor plate CE1 of the storage capacitor Cst, and the branch line BL. The interlayer insulating layer 113 may include, for example, an inorganic material such as silicon oxide, silicon nitride, and/or silicon oxynitride.

The node connection line NCL may be arranged on the interlayer insulating layer 113. For example, the node connection line NCL may include Cu, Al, Pt, Pd, Ag, Mg, Au, Ni, Nd, Ir, Cr, Li, Ca, and/or Mo. The node connection line NCL may have a single-layer structure or a multi-layer structure including the materials described above.

As described above, the node connection line NCL may electrically connect the first thin-film transistor T1 with the pixel electrode 210 to be described later. To this end, the node connection line NCL may be connected to the source area or the drain area of the first semiconductor layer A1 of the first thin-film transistor T1 through the second contact hole CNT2 which is defined in the interlayer insulating layer 113, and may be electrically connected to the pixel electrode 210 thereabove by a contact metal CM.

In an embodiment, the node connection line NCL may include the second capacitor plate CE2 of the storage capacitor Cst. In other words, the second capacitor plate CE2 may be provided as a portion of the node connection line NCL. Thus, a space may be used efficiently, and a degree of integration of the display device 1 may be improved.

The node connection line NCL may be connected to the third capacitor plate CE3 of the storage capacitor Cst through the tenth contact hole CNT10 which is defined in the interlayer insulating layer 113 and the buffer layer 111. Thus, the second capacitor plate CE2 of the storage capacitor Cst integrally provided as a single body with the node connection line NCL may have the same potential as the third capacitor plate CE3. As a result, the interlayer insulating layer 113 disposed between the first capacitor plate CE1 and the second capacitor plate CE2, and the gate insulating layer 112 and the buffer layer 111 disposed between the second capacitor plate CE2 and the third capacitor plate CE3 may serve as dielectric layers of the storage capacitor Cst. Through this structure, a capacitance of the storage capacitor Cst may increase.

In an embodiment, the node connection line NCL may include the repair portion RP overlapping the initialization voltage line INL. An area in which the repair portion RP and the initialization voltage line INL may be defined as the repair area RA.

A passivation layer 114 may be arranged on the interlayer insulating layer 113. The passivation layer 114 may cover the node connection line NCL. The passivation layer 114 may include, for example, an inorganic material such as silicon oxide, silicon nitride, and/or silicon oxynitride.

The contact metal CM may be arranged on the passivation layer 114. The contact metal CM may be connected to the node connection line NCL through a contact hole provided in the passivation layer 114. The contact metal CM may electrically connect the node connection line NCL and the pixel electrode 210 to each other. For example, the contact metal CM may include Cu, Al, Pt, Pd, Ag, Mg, Au, Ni, Nd, Ir, Cr, Li, Ca, and/or Mo considering conductivity.

A planarization insulating layer 115 may be arranged on the passivation layer 114. The planarization insulating layer 115 may cover the contact metal CM and provide a flat upper surface for the pixel electrode 210. The planarization insulating layer 115 may include an organic insulating material, and the organic insulating material may include, for example, a general-purpose polymer such as poly(methyl methacrylate) (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or any blends thereof.

The organic light-emitting diode OLED may be arranged on the planarization insulating layer 115. The organic light-emitting diode OLED may include a stacked structure of the pixel electrode 210, an emission layer 220, and an opposite electrode 230. In other words, the organic light-emitting diode OLED may include the pixel electrode 210, the emission layer 220 arranged on the pixel electrode 210, and the opposite electrode 230 arranged on the emission layer 220.

The pixel electrode 210 may include a transparent conducting oxide such as ITO, an indium zinc oxide (IZO), ZnO, $In_2O_3$, indium gallium oxide (IGO), or aluminum zinc oxide (AZO). In another embodiment, the pixel electrode 210 may include a reflective film including Ag, Mg, Al, Pt, Pd, Au, Ni, Nd, Ir, Cr, or any compounds thereof. In another embodiment, the pixel electrode 210 may further include a layer including ITO, IZO, ZnO, or $In_2O_3$, on or below the reflective layer described above. For example, the pixel electrode 210 may have a three-layer structure in which an ITO layer, an Ag layer, and another ITO layer are stacked.

An upper insulating film 117 may be arranged on the planarization insulating layer 115. The upper insulating film 117 may include an opening 117OP corresponding to a portion of the pixel electrode 210. The opening 117OP of the upper insulating film 117 may expose a central portion of the pixel electrode 210. The upper insulating film 117 may prevent an arc or the like from occurring at an edge of the pixel electrode 210 by increasing a distance between the edge of the pixel electrode 210 and the opposite electrode 230. The upper insulating film 117 as described above may include, for example, an organic material such as polyimide, hexamethyldisiloxane (HMDSO), or the like.

The emission layer 220 may be arranged on the pixel electrode 210 and the upper insulating film 117. The emission layer 220 may include a polymer material or a low-molecular weight organic material that emit light of a color. In some embodiments, the emission layer 220 may be patterned to correspond to each of the pixel electrodes 210 as shown in FIG. 6, but may be integrally provided as a single body across the plurality of pixel electrodes 210 as necessary.

Although not shown in FIG. 6, a first functional layer arranged below the emission layer 220 and/or a second functional layer arranged above the emission layer 220 may be further included. The first functional layer and the second functional layer may be included in an intermediate layer together with the emission layer 220, and may be between the pixel electrode 210 and the opposite electrode 230. The first functional layer may include a single layer or multiple layers. For example, when the first functional layer includes the polymer material, the first functional layer may include a hole transport layer (HTL), which has a single-layered structure, and may include poly-(3,4-ethylenedioxythiophene) (PEDOT) or polyaniline (PANI). In a case where the first functional layer includes the low-molecular weight organic material, the first functional layer may include a hole injection layer (HIL) and an HTL. The second functional layer may include an electron transport layer (ETL) and/or an electron injection layer (EIL).

The opposite electrode 230 may include a conductive material having a low work function. For example, the opposite electrode 230 may include a (semi) transparent layer including Ag, Mg, Al, Pt, Pd, Au, Ni, Nd, Ir, Cr, Li, Ca, or any alloys thereof. In some embodiments, the opposite electrode 230 may further include a layer including IZO, ZnO, or $In_2O_3$ on the (semi) transparent layer including the above-mentioned material.

The organic light-emitting diode OLED may be easily damaged by the moisture or oxygen from the outside and therefore may be protected by being covered with an encapsulation layer 300. The encapsulation layer 300 may include at least one organic encapsulation layer and at least one inorganic encapsulation layer. In an embodiment, the encapsulation layer 300 may include a first inorganic encapsulation layer 310, an organic encapsulation layer 320, and a second inorganic encapsulation layer 330.

The first inorganic encapsulation layer 310 and the second inorganic encapsulation layer 330 may each include one or more inorganic insulating materials. The inorganic insulating layer may include $Al_2O_3$, tantalum oxide, hafnium oxide, ZnO, silicon oxide, silicon nitride, and/or silicon oxynitride. The organic encapsulation layer 320 may include a polymer-based material. The polymer-based material may include an acryl-based resin, an epoxy-based resin, polyimide, and polyethylene. The acryl-based resin may include, for example, PMMA, polyacrylic acid, and the like.

Although not shown in FIG. 6, the color-conversion-transmitting layer 500 (see FIG. 2) described above with reference to FIG. 2 may be arranged on the opposite electrode 230 of the organic light-emitting diode OLED. In addition, the color filter layer may be arranged on the color-conversion-transmitting layer 500.

Figure 7A:
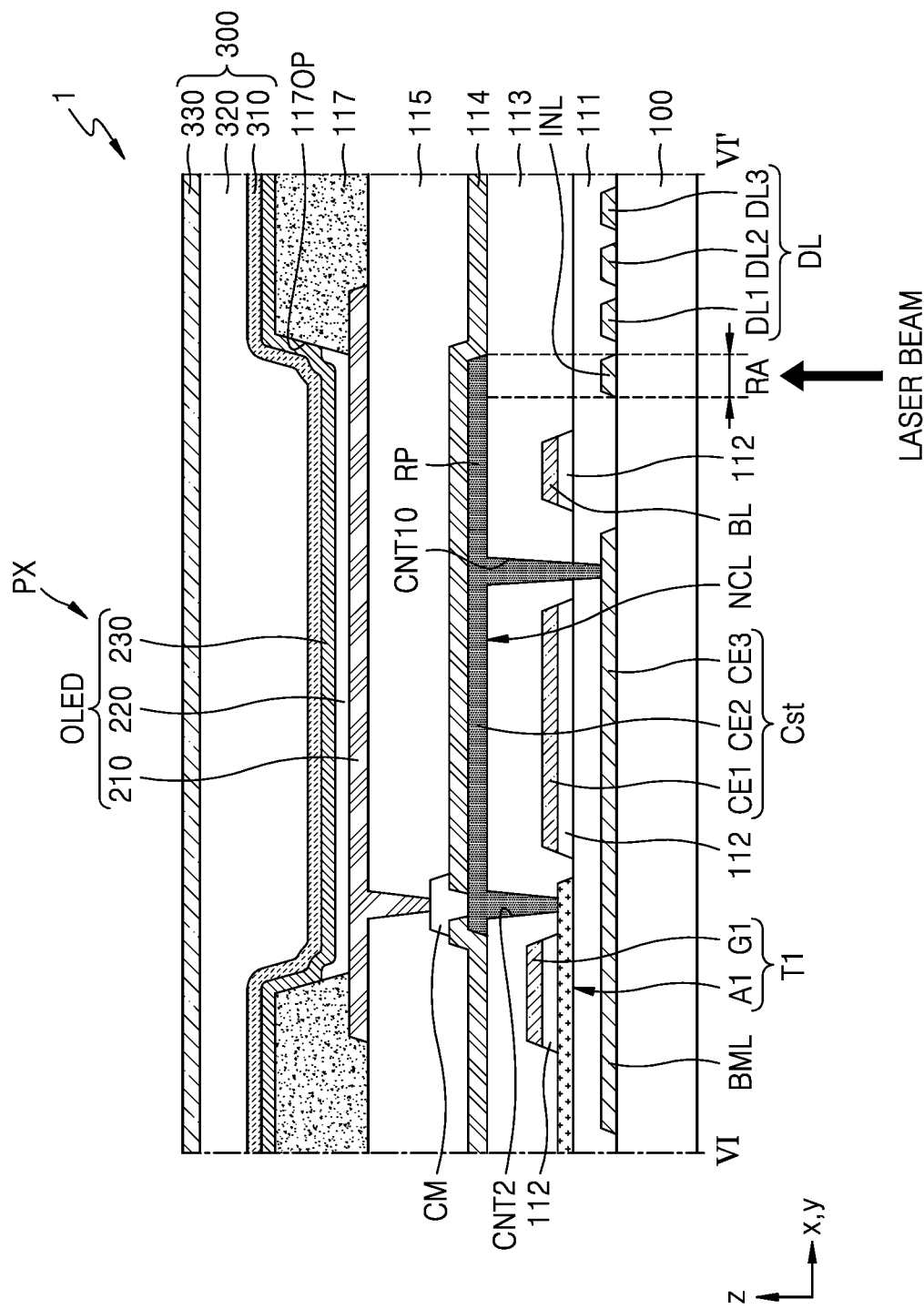
FIGS. 7A and 7B are cross-sectional views schematically illustrating operations of a method of repairing a display device, according to an embodiment.
Figure 7B:
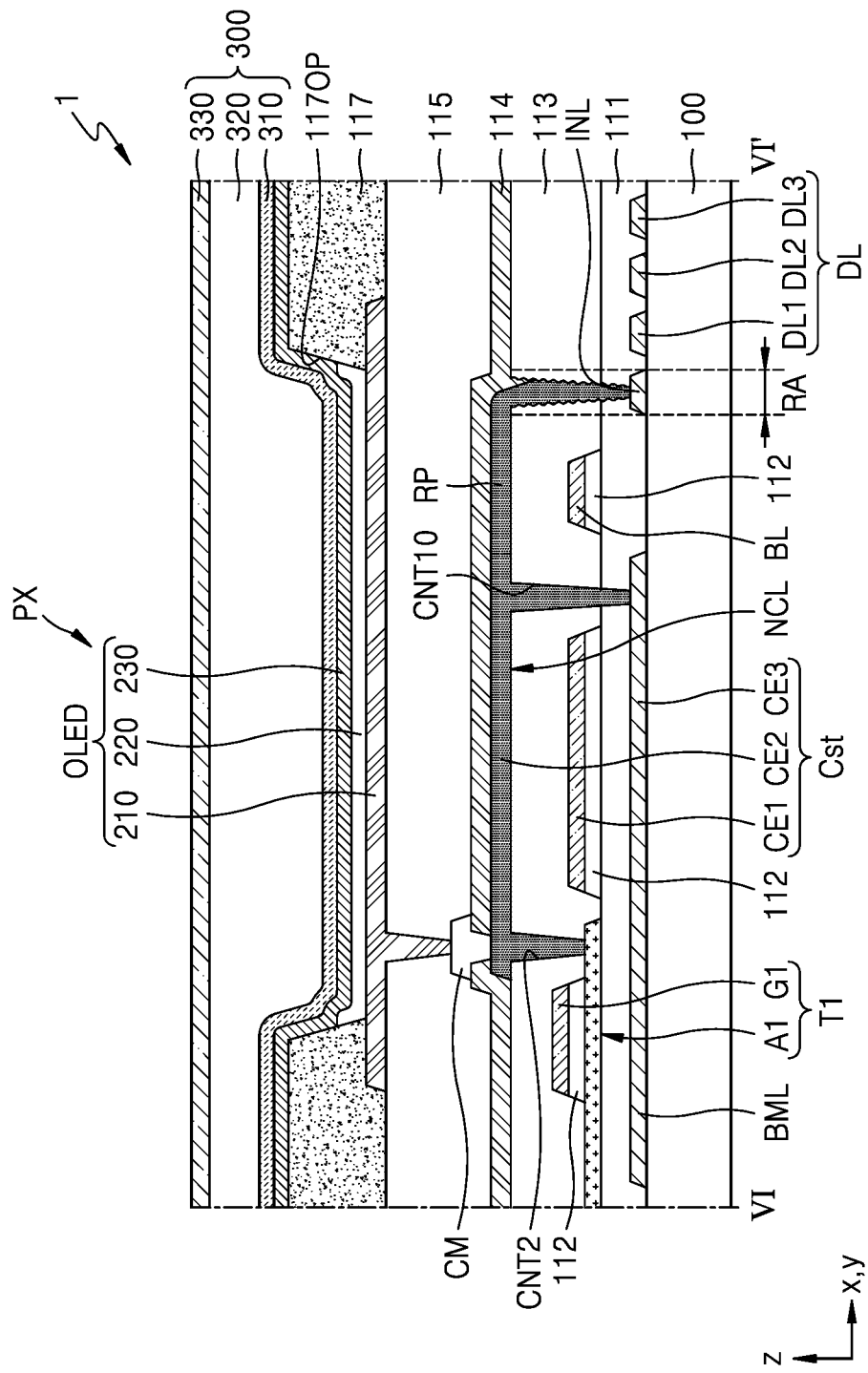

FIGS. 7A and 7B are cross-sectional views schematically illustrating operations of a method of repairing a display device 1, according to an embodiment.

FIG. 7A shows the display device 1 during a repair process, and FIG. 7B shows the display device 1 after the repair process. In FIGS. 7A and 7B, the same reference numerals as those of FIG. 6 denote the same elements, and redundant descriptions thereof will be omitted.

Referring to FIG. 7A, when a defect occurs in the pixel circuit PC (see FIG. 5), the repair portion RP of the node connection line NCL of the corresponding pixel circuit PC and the initialization voltage line INL may be shorted to each other. To this end, in an embodiment, a laser beam may be irradiated to the repair portion RP in which the repair portion RP and the initialization voltage line INL overlap each other.

For example, a type of laser used may be an excimer laser. For example, the excimer laser may have a short wavelength of about 308 nm. In another example, types of the laser may include a $CO_2$ laser, a YAG laser, a nanosecond laser, a femtosecond laser, a Bessel beam, or a Gaussian beam.

In FIG. 7A, the laser beam is irradiated from a lower surface of the substrate 100 to a direction facing the node connection line NCL (for example, along a +z direction), but the present disclosure is not limited thereto. For example, before the organic light-emitting diode OLED is formed, the laser beam may also be irradiated from the node connection line NCL to a direction facing the upper surface of the substrate 100 (for example, along a -z direction).

Referring to FIG. 7B, the repair portion RP of the node connection line NCL and the initialization voltage line INL may be shorted to each other in the repair area RA. For example, as the buffer layer 111 and the interlayer insulating layer 113 absorb a laser beam, a hole penetrating through the buffer layer 111 and the interlayer insulating layer 113 is formed, and the repair portion RP of the node connection line NCL may be connected to the interlayer insulating layer 113 therebelow through the hole. In this case, the initialization voltage line INL does not go through a thin-film transistor, but may apply an initialization voltage to the pixel electrode 210 of the organic light-emitting diode OLED through the node connection line NCL. Thus, the organic light-emitting diode OLED may not always emit light, and the corresponding pixel PX may include a dark spot. Thus, a bright spot defect may be resolved.

Figure 8:
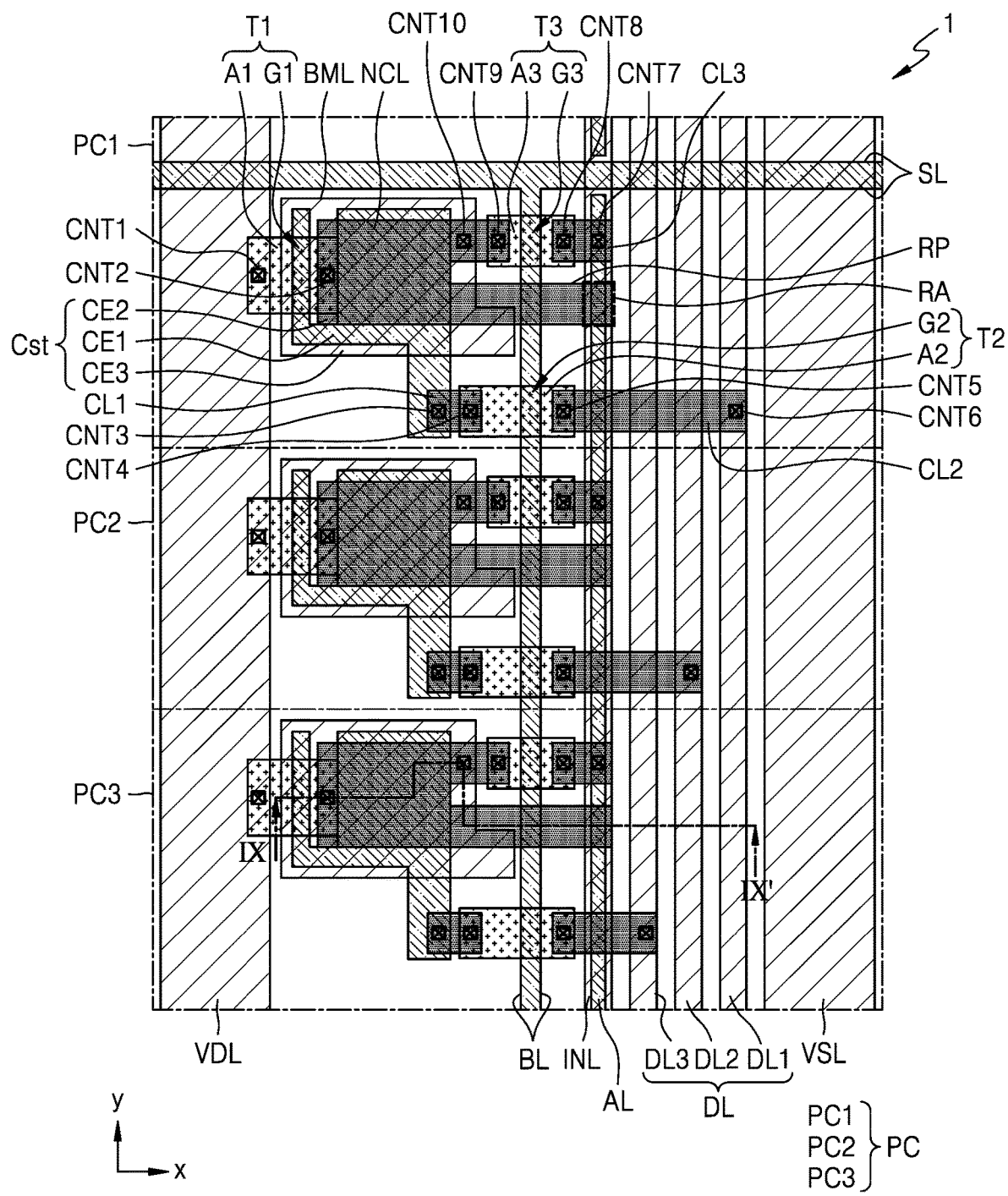
FIG. 8 is a plan view schematically illustrating a portion of a display device according to another embodiment.
Figure 9:
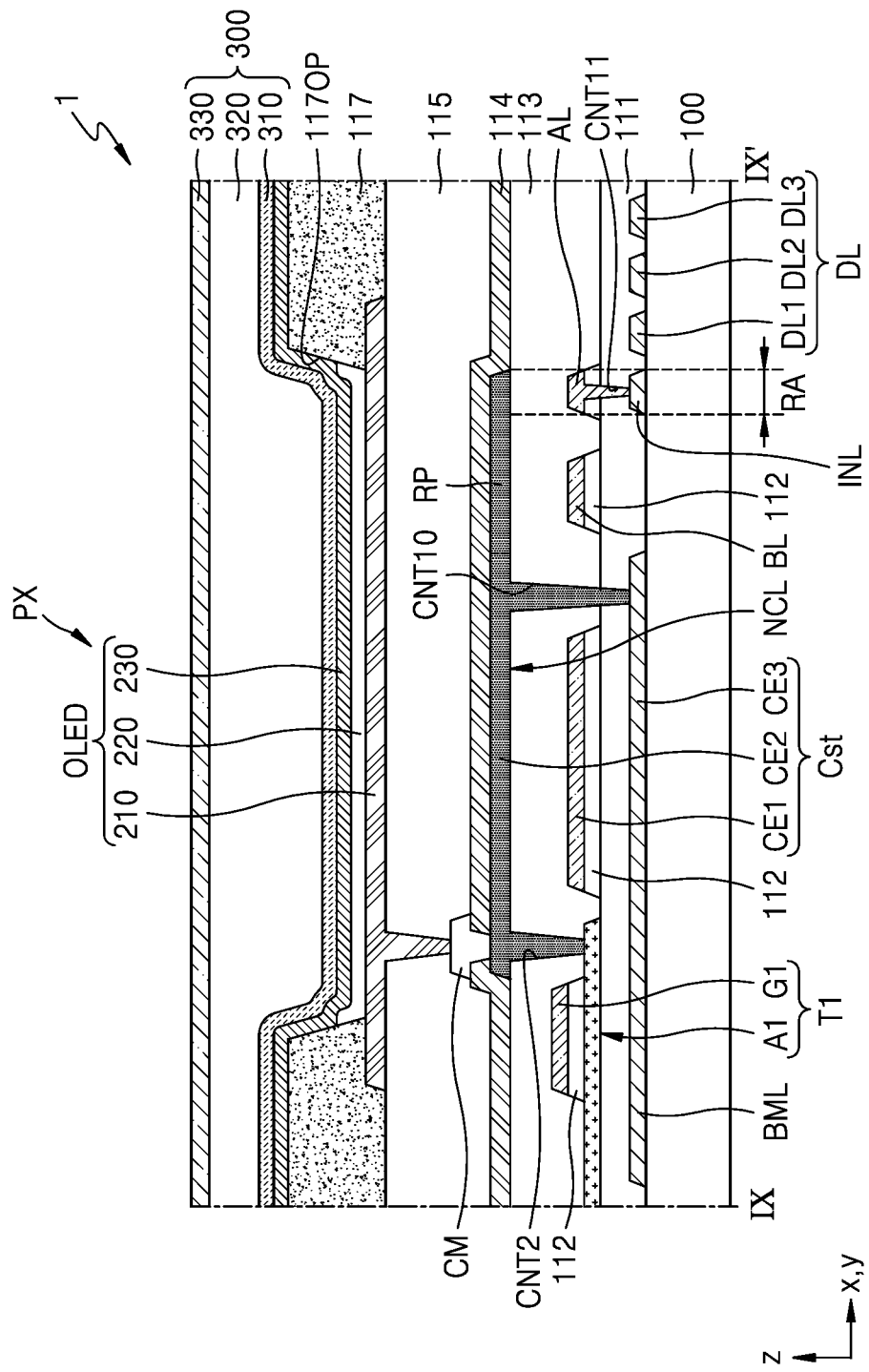
FIG. 9 is a cross-sectional view schematically illustrating a cross-section of the display device in FIG. 8, taken along line IX-IX' in FIG. 8.
Figure 10:
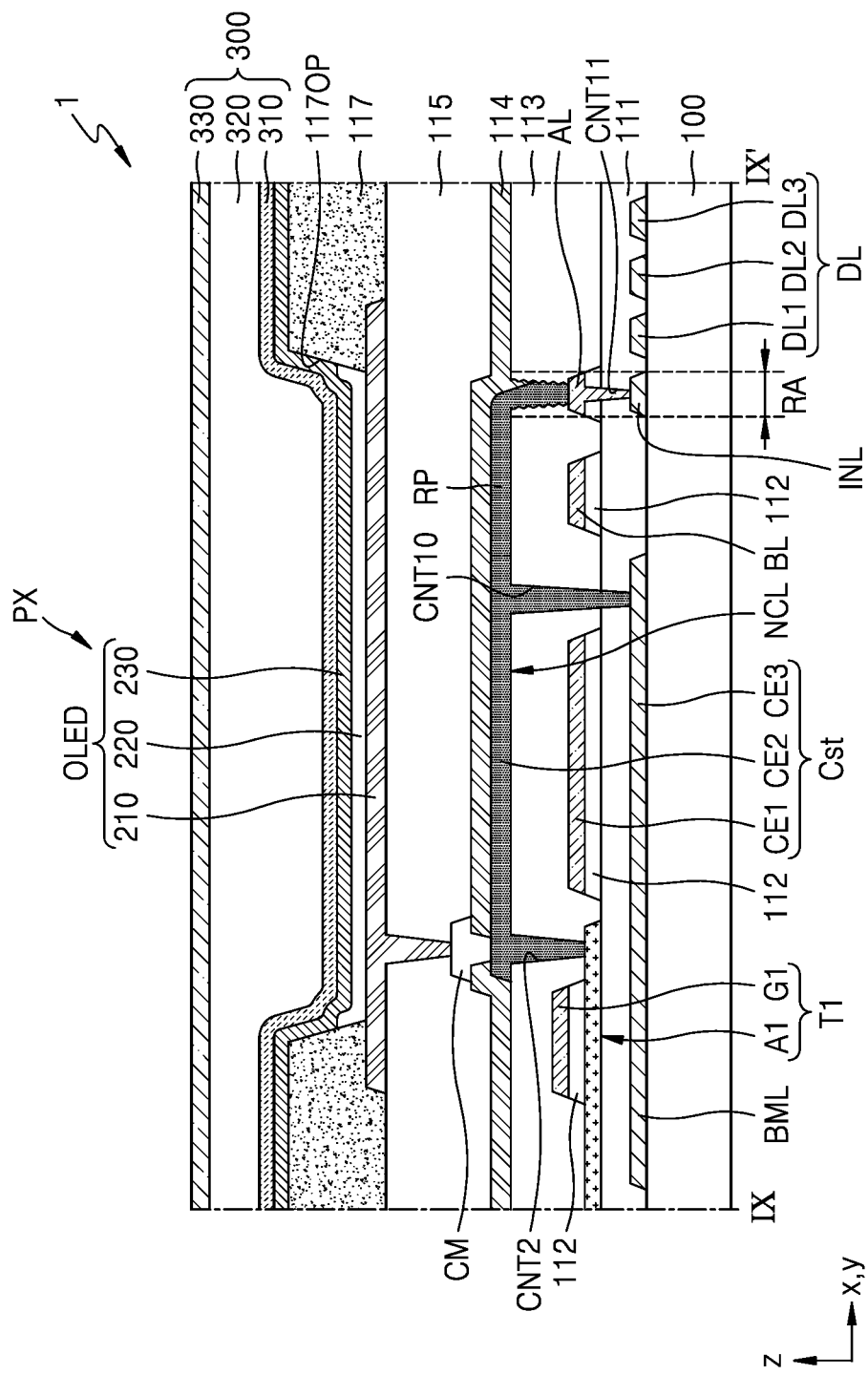
FIG. 10 is a cross-sectional view schematically illustrating a cross-section of the display device in FIG. 9 after a process of repairing of the display device, according to an embodiment.

FIG. 8 is a plan view schematically illustrating pixel circuits provided in a display device 1 according to another embodiment, FIG. 9 is a cross-sectional view schematically illustrating a cross-section of the display device 1 in FIG. 8, taken along line IX-IX' in FIG. 8, and FIG. 10 is a cross-sectional view schematically illustrating a cross-section of the display device 1 in FIG. 9 after a process of repairing of the display device 1. Redundant description of the elements previously described above with reference to FIGS. 5, 6, 7A, and 7B will be omitted, and differences will be mainly described below.

Referring to FIGS. 8 and 9, the display device 1 may further include an auxiliary line AL extending in the same direction (for example, along a y direction) as an extension direction of the initialization voltage line INL. In an embodiment, the auxiliary line AL may be arranged to overlap the initialization voltage line INL in a plan view. The auxiliary line AL may be between the repair portion RP of the node connection line NCL and the initialization voltage line INL in a cross-sectional view. The auxiliary line AL may be formed in the same process as the first gate electrode G1 of the first thin-film transistor T1, and may include the same material as the first gate electrode G1.

For example, the auxiliary line AL may be electrically connected to the initialization voltage line INL through an eleventh contact hole CNT11 provided in the buffer layer 111 and the interlayer insulating layer 113. The auxiliary line AL may perform a function of transferring an initialization voltage along with the initialization voltage line INL. Through the auxiliary line AL, an overall resistance of the initialization voltage line INL may be reduced, and thus, an RC delay may be reduced.

Referring to FIG. 10, by irradiating a laser beam to the repair area RA, the repair portion RP of the node connection line NCL and the initialization voltage line INL may be shorted to each other, but the repair area RA may be electrically connected to the initialization voltage line INL through the auxiliary line AL therebelow. In other words, a portion of the auxiliary line AL located in the repair area RA may function as a connection member of the repair portion RP and the initialization voltage line INL. In this case, for example, a hole for the short may be formed only in the interlayer insulating layer 113, and thus, a quicker and easier repair may be performed.

Figure 11:
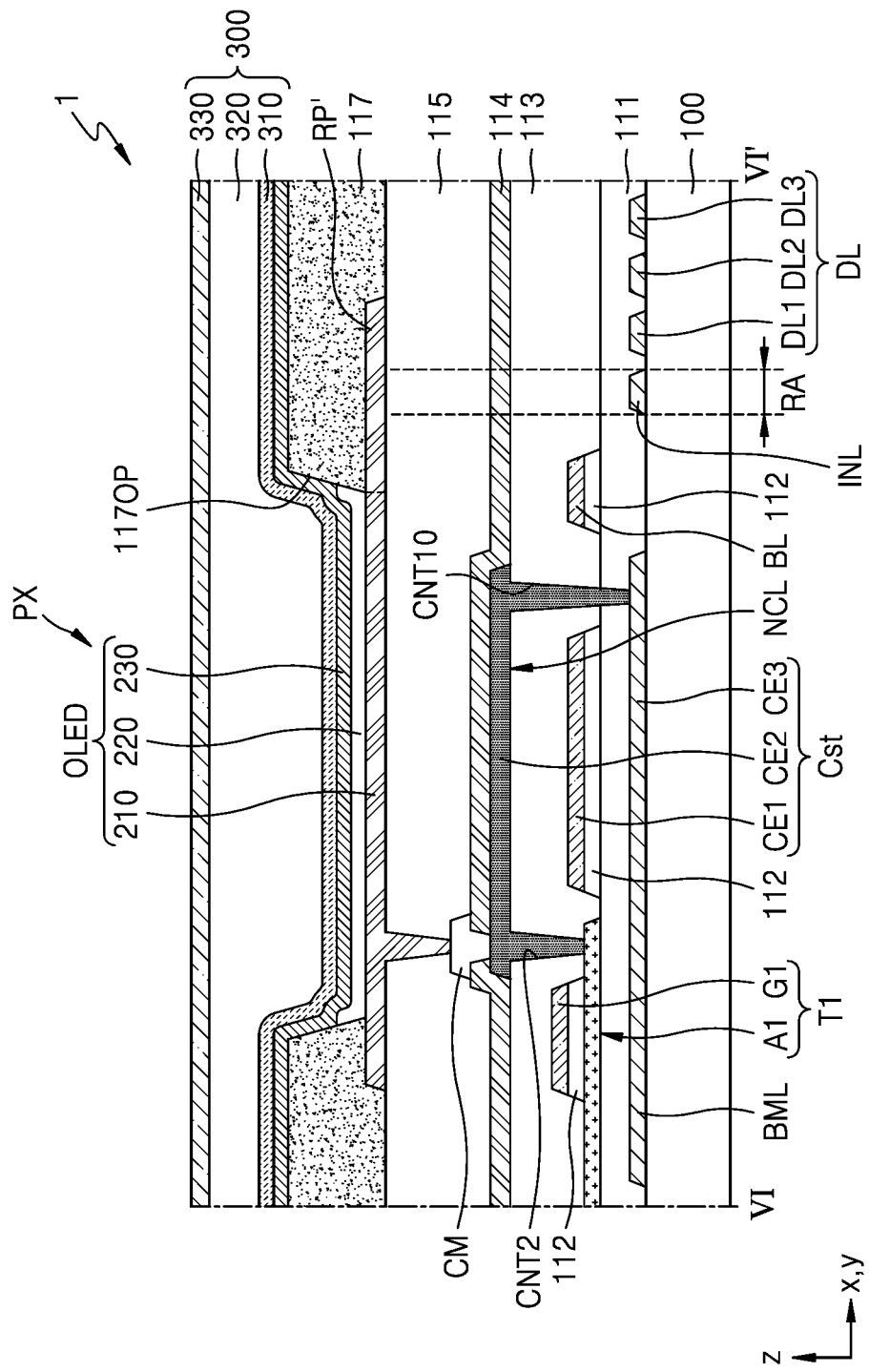
FIG. 11 is a cross-sectional view schematically illustrating a cross-section of a display device according to another embodiment.
Figure 12:
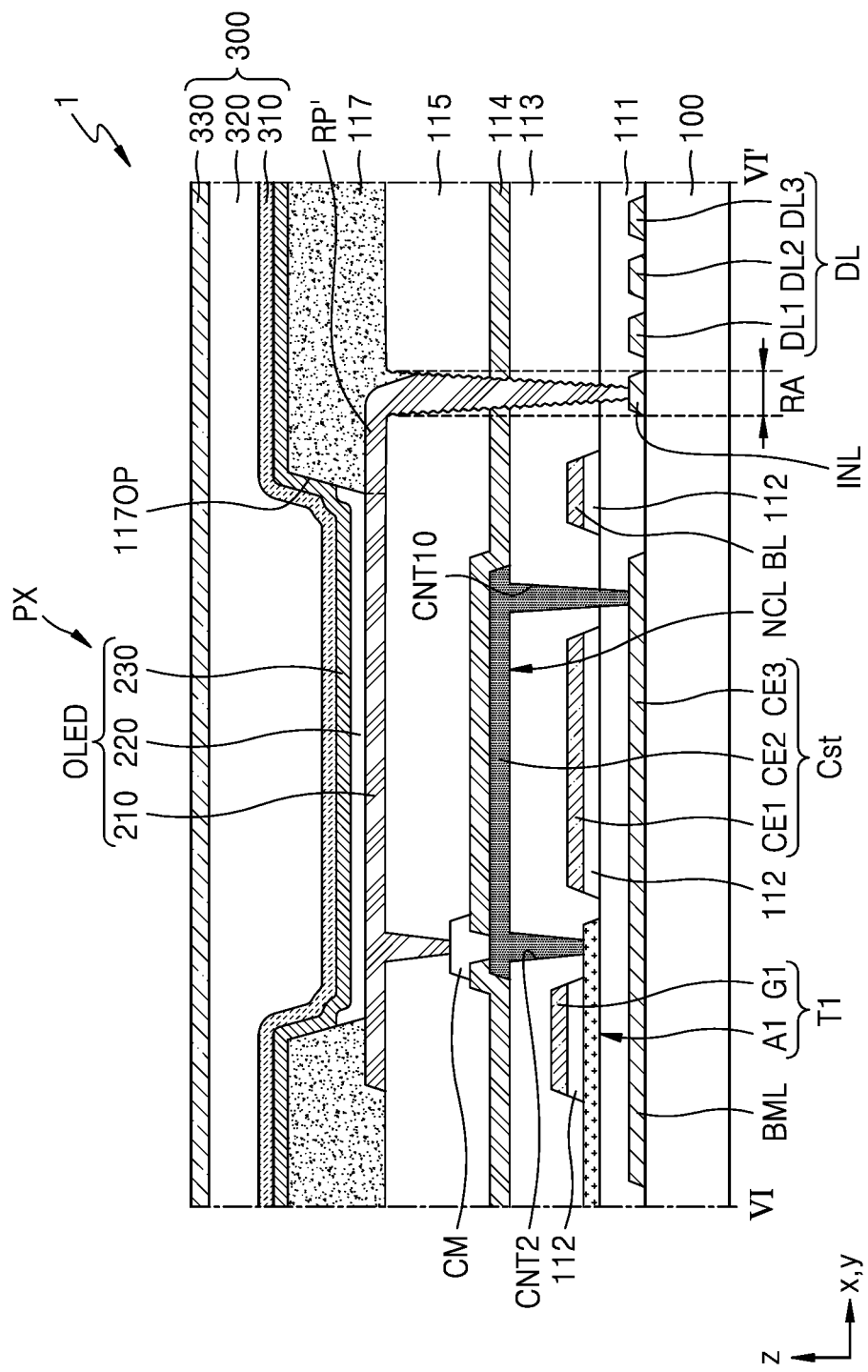
FIG. 12 is a cross-sectional view schematically illustrating a cross-section of the display device in FIG. 11 after a process of repairing of the display device, according to an embodiment.

FIG. 11 is a cross-sectional view schematically illustrating a cross-section of the display device 1 in FIG. 5, taken along line VI-VI' in FIG. 5, according to an embodiment. FIG. 12 is a cross-sectional view schematically illustrating a cross-section of the display device 1 in FIG. 11 after a process of repairing of the display device 1. Redundant description of the elements previously described above with reference to FIGS. 6, 7A, and 7B will be omitted, and differences will be mainly described below.

Referring to FIG. 11, the pixel electrode 210 may include a repair portion RP' overlapping the initialization voltage line INL in a plan view, but the repair portion RP' may not overlap the opening 1170P of the upper insulating film 117. For example, the repair portion RP' may be covered with the upper insulating film 117. At least the repair area RA, which is an area in which the repair portion RP' of the pixel electrode 210 and the initialization voltage line INL overlap each other, may not overlap the opening 1170P of the upper insulating film 117.

Referring to FIG. 12, the repair portion RP' of the pixel electrode 210 and the initialization voltage line INL may be shorted to each other. For example, a laser beam may be irradiated to the repair area RA to thereby connect the repair portion RP' of the pixel electrode 210 and the initialization voltage line INL to each other. In this case, the initialization voltage line INL does not go through a thin-film transistor, but may directly apply an initialization voltage to the pixel electrode 210 of the organic light-emitting diode OLED. Thus, the organic light-emitting diode OLED may not always emit light, and the corresponding pixel PX may include a dark spot. Thus, a bright spot defect may be resolved.

Although the display device and the method of repairing the display device have been mainly described, the present disclosure is not limited thereto. For example, it may be understood that display manufacturing methods for manufacturing such a display device also fall within the scope of the present disclosure.

According to an embodiment configured as described above, a display device in which a bright spot occurring due to a defective pixel circuit may be repaired into a dark spot, and a method of repairing the display device may be implemented. According to an embodiment, a simpler and quicker repair may be performed, and thus, the productivity and yield of the display device may be improved. In addition, design restrictions on the display device for repair may be minimized, thereby implementing a display device of a high resolution. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate;
a thin-film transistor arranged on the substrate and including a semiconductor layer and a gate electrode overlapping at least a portion of the semiconductor layer;
a pixel electrode arranged on the substrate;
a node connection line separate from the pixel electrode and disposed on a different layer than the gate electrode and configured to connect the thin-film transistor and the pixel electrode to each other; and
an initialization voltage line arranged on the substrate and extending in a first direction,
wherein the node connection line includes a repair portion overlapping the initialization voltage line in a plan view,
wherein an interlayer insulating layer covers the gate electrode, and the node connection line is disposed on an opposite surface of the interlayer insulating layer to a surface of the interlayer insulating layer contacting the gate electrode, and
wherein the pixel electrode contacts an emission layer and is disposed between the node connection line and the emission layer in a direction perpendicular to the substrate.

2. The display device of claim 1, further comprising a data line arranged on the substrate and extending in the first direction,
wherein the initialization voltage line is arranged closer to the thin-film transistor than the data line in a plan view.

3. The display device of claim 2, wherein the node connection line does not overlap the data line in a plan view.

4. The display device of claim 1, further comprising a storage capacitor including a first capacitor plate and a second capacitor plate overlapping each other,
wherein the first capacitor plate and the gate electrode of the thin-film transistor include a same material, and
the second capacitor plate includes a portion of the node connection line.

5. The display device of claim 1, further comprising a bottom metal layer arranged between the substrate and the semiconductor layer of the thin-film transistor.

6. The display device of claim 5, wherein the initialization voltage line and the bottom metal layer include a same material.

7. The display device of claim 5, further comprising a storage capacitor including a first capacitor plate, a second capacitor plate and a third capacitor plate overlapping each other,
wherein the first capacitor plate and the gate electrode of the thin-film transistor include a same material, and
the third capacitor plate includes a portion of the bottom metal layer.

8. The display device of claim 1, wherein the repair portion of the node connection line is connected to the initialization voltage line through a contact hole.

9. The display device of claim 1, further comprising:
a scan line extending in a second direction crossing the first direction; and
a branch line extending in the first direction from the scan line.

10. The display device of claim 9, wherein the scan line, the branch line, and the gate electrode of the thin-film transistor include a same material.

11. The display device of claim 1, further comprising:
an opposite electrode arranged on the emission layer;
a color-conversion-transmitting layer arranged on the opposite electrode; and
a color filter layer arranged on the color-conversion-transmitting layer,
wherein the color-conversion-transmitting layer converts light of a first color emitted from the emission layer into light of a second color different from the first color, or transmits the light of the first color without color conversion.

12. The display device of claim 1, further comprising an auxiliary line disposed between the repair portion of the node connection line and the initialization voltage line, and electrically connected to the initialization voltage line.

13. The display device of claim 12, wherein the auxiliary line and the gate electrode of the thin-film transistor include a same material.

14. The display device of claim 12, wherein the repair portion of the node connection line is electrically connected to the initialization voltage line through the auxiliary line.

* * * * *